US008686727B2

(12) United States Patent
Reddy et al.

(10) Patent No.: US 8,686,727 B2
(45) Date of Patent: Apr. 1, 2014

(54) CEST MRI METHODS FOR IMAGING OF METABOLITES AND THE USE OF SAME AS BIOMARKERS

(75) Inventors: Ravinder Reddy, Gladwyne, PA (US); Hari Hariharan, Mount Laurel, NJ (US); Mohammad Haris, Philadelphia, PA (US); Kejia Cai, Elkins Park, PA (US); Anup Singh, Philadelphia, PA (US); Feliks Kogan, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 427 days.

(21) Appl. No.: 13/186,981

(22) Filed: Jul. 20, 2011

(65) Prior Publication Data

US 2012/0019245 A1 Jan. 26, 2012

Related U.S. Application Data

(60) Provisional application No. 61/365,871, filed on Jul. 20, 2010.

(51) Int. Cl.
*G01V 3/00* (2006.01)
(52) U.S. Cl.
USPC ..................... 324/307; 324/309; 600/420
(58) Field of Classification Search
USPC .......... 324/307, 309, 312, 314, 300; 600/410, 600/420
See application file for complete search history.

(56) References Cited

U.S. PATENT DOCUMENTS

| | | | | |
|---|---|---|---|---|
| 6,963,769 | B1 * | 11/2005 | Balaban et al. | 600/420 |
| 7,330,748 | B2 * | 2/2008 | Balaban et al. | 600/420 |
| 7,610,077 | B2 * | 10/2009 | Dixon et al. | 600/420 |
| 2011/0054299 | A1 * | 3/2011 | Ling et al. | 600/410 |
| 2012/0271159 | A1 * | 10/2012 | Song et al. | 600/420 |
| 2013/0190601 | A1 * | 7/2013 | Alsop et al. | 600/410 |

OTHER PUBLICATIONS

Castillo et al., "Correlation of myo-inositol levels and grading of cerebral astrocytomas," AJNR Am. J. Neuroradiol., Oct. 2000, 21(9), 1645-1649.
van Zijl et al., "MRI detection of glycogen in vivo by using chemical exchange saturation transfer imaging (glycoCEST)," Proc. Natl. Acad. Sci. USA, Mar. 13, 2007, 104(11), 4359-4364.

* cited by examiner

*Primary Examiner* — Louis Arana
(74) *Attorney, Agent, or Firm* — Baker & Hostetler LLP

(57) ABSTRACT

The CEST effect for various neurotransmitters and energy metabolites in the brain and muscles and various endogenous metabolites in the liver, brain, and myocardium are imaged using MR imaging to illustrate a unique CEST effect that may be used to monitor the concentration of the metabolite and hence to characterize and monitor various disease states in the body correlated to the concentration of that metabolite. By adjusting the timing, amplitude, and length of the RF pulse as well as other parameters of the CEST pulse sequence to address the unique chemical shifts and exchange rates of the target, new targets with unique characteristics may be acquired using CEST MR imaging.

21 Claims, 28 Drawing Sheets

CEST MRI METHODS FOR IMAGING OF METABOLITES AND THE USE OF SAME AS BIOMARKERS

CROSS REFERENCE TO RELATED APPLICATIONS

This application claims benefit of U.S. Provisional Application No. 61/365,871 filed Jul. 20, 2010. The contents of that application are hereby incorporated by reference.

GOVERNMENT SUPPORT

The present invention was supported by the National Center for Research Resources under grant number P41RR002305 (Ravinder Reddy). The government may have certain rights in the invention.

TECHNICAL FIELD

The invention relates to techniques for imaging the Chemical Exchange Saturation Transfer (CEST) effect caused by the exchange of various protons with bulk water in the body and the use of the CEST effect for certain metabolites in the body as biomarkers.

BACKGROUND

Magnetic resonance imaging (MRI) is a non-invasive imaging technique that provides images with excellent soft tissue contrast. MR imaging contrast of biological tissues is generally based on the relaxation properties of water protons, which usually reflects a combination of spin-spin (T2) and spin-lattice (T1) relaxation. MRI detects the signal from bulk protons in biological tissues as they have long T2 relaxation.

Chemical Exchange Saturation Transfer (CEST) is a technique that provides an indirect way of detecting the signal from exchangeable protons with bulk water. Those exchangeable protons are typically associated with macromolecules or small metabolite molecules. CEST imaging uses an off-resonance saturation pulse at the resonance frequency of exchanging protons to null the signal from exchangeable protons in order to indirectly decrease bulk water signal through chemical exchange, creating a detectable contrast from bulk water. CEST contrast can be turned "on" and "off" by simply changing the saturation RF frequency and is highly specific to CEST agents that possess distinct resonance frequencies. FIG. 1 illustrates a pulse diagram of CEST imaging. Here the readout sequence is shown as a single pulse acquire method, but one could use any type of imaging readout to measure the CEST effect.

By way of brief overview of CEST in biological tissues, consider two nuclear spin I=1/2 systems, A (solvent) and B (solute), with a distinct chemical shift difference, $\Delta\omega$, and an exchangeable proton on the solute that exchanges with water solvent protons. In a static magnetic field, application of a long low power RF pulse at the resonance of (B) without affecting the resonance of A leads to the equalization of the populations in the two spin states of B, a situation referred to as spin saturation, and no signal is observed from spin B. Since the B spins are in exchange with that of A spins, the saturated magnetization is transferred to A spins and a concomitant decrease in the signal intensity of the A spins occurs. Subsequently, longitudinal relaxation returns each nuclear spin system to its equilibrium values and eventually the system reaches a steady state. This effect is termed chemical exchange saturation transfer (CEST). The saturation transfer magnetization is then imaged to detect the CEST effect from nuclear spins B. In order for the CEST effect to be efficiently observed, the slow to intermediate exchange condition ($\Delta\omega > k$) must be fulfilled.

In implementing this method in vivo, and interpreting the results there are several issues one has to address: (i) the direct saturation of water and the background magnetization transfer effect in biological tissues; (ii) the amplitude and duration of the saturation pulse and efficiency of saturation. To account for the first, one has to obtain two images, one with saturation at the resonance frequency of exchanging spin(s) and the other at the equal frequency offset difference on the other side of the bulk water peak and then compute the difference as CEST asymmetry ($CEST_{asym}$) ratio, which provides the CEST effect of the source spins. This is given by Equation [1], $$CEST_{asym}(\Delta\omega) = \frac{M_{sat}(-\Delta\omega) - M_{sat}(\Delta\omega)}{M_0} \quad [1]$$

where $M_0$ is the equilibrium magnetization when saturation frequency is set far from the water resonance, such as 20 ppm down field of the water resonance, $M_{sat}(\pm\Delta\omega)$ are the magnetizations obtained with saturation at a '+' or '−' $\Delta\omega$ offset of the water resonance. The role of amplitude and duration of the saturation pulse can be incorporated into a general solution of a two-site exchange model in the presence of RF saturation as shown in Equation [2]:

$$CEST_{asym}(\Delta\omega) = \frac{k\alpha f}{R_{1w} + kf}[1 - e^{-(R_{1w}+kf)t_{sat}}] \quad [2]$$

where k is exchange rate (s$^{-1}$ or Hz), $\alpha$ is the factor that accounts for suboptimal saturation with 1 describing complete saturation (at high enough $B_1$ amplitude of saturation pulse). For MI CEST imaging, $f=n[MI]/2[H_2O]$ is the fraction of exchangeable protons on MI (n=6 for six —OH), $R_{1w}$ (=1/$T_{1w}$) is the longitudinal relaxation rate of water protons and $t_{sat}$ is the length of the of the saturation pulse. MI $CEST_{asym}$ contrast is referred to as MICEST.

CEST contrast can originate from endogenous amide, amine, and hydroxyl protons or from exchangeable sites on exogenous contrast agents. The CEST effect from amide protons of mobile proteins/peptides has been reported and the potential to measure the pH using these amide protons in biological conditions also has been explored. However, the CEST effect from amide protons is not protein/peptide specific and thus cannot be used in detection of a particular protein or peptide. Thus, disease specific CEST biomarkers which have exchangeable protons at distinct resonance frequencies away from water resonance will have great clinical and commercial significance.

CEST has been used to study different metabolites. For example, labile amide proton (—NH) exchange with bulk water has been exploited to map pH changes in tissues as well as the protein content in the brain, while —OH exchange has been used to measure the proteoglycan concentration in cartilage as well as glycogen concentration changes in the liver. CEST has also been used to generate exogenous contrast using contrast agents with exchangeable protons. Applying RF irradiation at the exchangeable proton resonance leads to reduction in the bulk water signal that can be detected as a negative contrast with proton MRI.

Although $^1$H magnetic resonance spectroscopy (MRS) techniques have been used to measure metabolites, these approaches are riddled with technical difficulties due to several confounding factors, such as very low spatial resolution, high detection limits, spectrum overlapping with other metabolites and complicated unreliable signal processing. It is desired to provide high spatial resolution, high specificity detection of various metabolites in the body without overlapping with other metabolites and to turn on and off the CEST contrast. Such methods are desired to assist in the diagnosis and treatment monitoring of various disorders in the brain (e.g. multiple sclerosis (MS), Parkinson's disease, stroke, Alzheimer's disease, etc.) and liver (e.g. cirrhosis and carcinoma), for example.

SUMMARY

The invention provides high spatial resolution, high specificity detection of various metabolites in the body without overlap with other metabolites by applying a Chemical Exchange Saturation Transfer (CEST) saturation pulse train at a range of frequency offsets around a frequency of exchangeable protons of a target metabolite as well as the same frequency offsets on the opposite of the water resonance, MR imaging a slice of the body containing the target metabolite to which the CEST saturation pulse has been applied using an MR imaging system modified to implement CEST imaging, determining a CEST contrast image by taking a ratio of a difference image obtained by subtraction of preferably $B_0$ and $B_1$ corrected saturation images obtained with saturation applied at both positive and negative frequencies with respect to water resonance and an image with no saturation, and displaying the subtraction image. The CEST saturation pulse is adjusted to different metabolites of interest by adjusting an amplitude and duration of the CEST saturation pulse based on the proton exchange rate of the target metabolite. The CEST saturation pulse train may include a variable number of pulses with variable shapes including rectangle and Hanning windowed rectangle, as well as variable amplitudes, variable durations, and delays. Embodiments are described herein for target metabolites including gamma-aminobutyric acid, glutamate, myo-inositol, adenosine triphosphate (ATP), phospho-creatine, creatine, glycine, proline, albumin, alanine, and aspartate. The same technique may be used to identify other target metabolites of interest.

Once obtained, the concentration of the metabolite in the subtraction image may be used as a biomarker for monitoring disease states correlated to the metabolite concentration. Such diseases include multiple sclerosis, Parkinson's disease, stroke, ALS, Alzheimer's, brain tumors, migraines, cerebrovascular diseases, anxiety symptoms, irritability, headaches, hypertension, palpitations, seizures, hypertensive heart disease, aortic valve disease, dilated cardiomyopathy, infracted myocardium, ischemic-hypoxic brain insult, brain and neck tumors, cirrhosis, liver fibrosis, and the like.

The CEST imaging technique and MR scanning system of the invention may also be used to stage liver fibrosis and characterize liver function by monitoring changes in the concentration of liver metabolites including proline, albumin, aspartate, and/or alanine in the CEST contrast image as well as to differentiate non-infarcted viable myocardial tissue from infarcted tissue by measuring changes in the concentration of creatine and pH levels in the subtraction image generated by CEST imaging in accordance with the invention. High resolution images also may be used to distinguish a region of the myocardium that is partially ischemic from non-infarcted myocardial viable myocardial tissue. Also, the myocardium CEST imaging technique of the invention may be used to determine viable myocardium by inducing stress in the myocardium, which leads to the increased production of creatine. The CEST mapping of the creatine levels may then be used to monitor changes in the creatine levels in response to stress, thus substituting for current stress test protocols (based on exogenous radioligands) for the heart. Similar techniques may be used to differentiate well perfused muscle tissue from under perfused muscle tissue based on measured changes in the concentration of creatine in the subtraction image, with or without first inducing stress in the muscle tissue.

The CEST imaging technique and MR scanning system of the invention further may be used to measure the concentration of myo-inositol (MI) in the subtraction image of a subject's brain as a biomarker for monitoring disease states such as Alzheimer's Disease correlated to the concentration of myo-inositol in the subject's brain, progression of the disease states, and/or efficacy of treatment of the disease states. Also, pH changes in the brain may be measured to distinguish a region of hypoxia and stroke that is partially ischemic from healthy brain tissue.

BRIEF DESCRIPTION OF THE DRAWINGS

The above and other features and advantages of the invention will be apparent from the following detailed description of the figures, of which:

FIG. 17A shows the anatomical image from a swine animal model of acute myocardial infarction, while FIG. 17B shows the CEST map generated at ~1.8 ppm illustrating higher CEST contrast in the non-infarcted region than the infarcted region.

FIG. 18A shows the three —OH peaks downfield to bulk water proton resonance and resonances from —CH groups up field from water, and the inset shows the chemical structure of MI.

FIG. 18B illustrates the MI spectrum at pH 7.0 showing MI —CH resonances as well as broad —OH resonance, while FIG. 18C illustrates the spectrum from PBS alone.

FIG. 20A shows the MI signal overlay on the CEST image obtained at –0.6 ppm, FIG. 20B shows the linear dependence of MICEST effect on MI concentration with a slope of 0.74% per mM MI, and FIG. 20C depicts the changes in MICEST contrast with varying $B_1$ and saturation pulse duration.

FIG. 23A shows the T2 weighted image, FIGS. 23B and 23C represent the corresponding $B_0$ and $B_1$ maps of the same slice, FIG. 23D shows MICEST map from an axial slice of human brain, and FIGS. 23E and 23F show the CEST maps from segmented white and gray matter regions, respectively.

DETAILED DESCRIPTION OF ILLUSTRATIVE EMBODIMENTS

Figure 1:
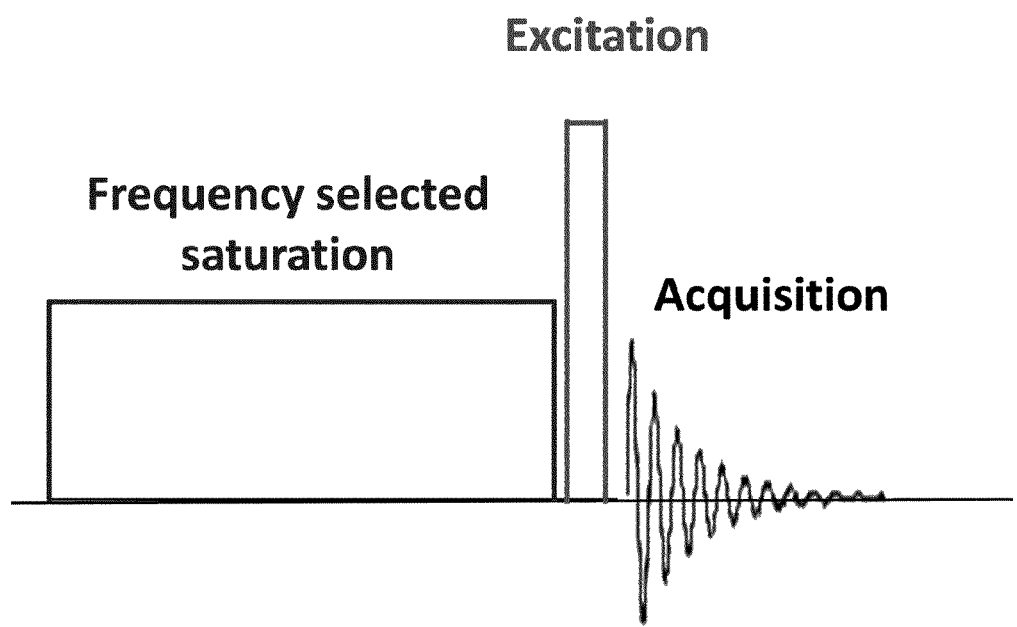
FIG. 1 illustrates a pulse diagram of CEST imaging where the readout sequence is shown as a single pulse acquire method, but one could use any type of imaging readout to measure the CEST effect.

Certain specific details are set forth in the following description with respect to FIGS. 1-31 to provide a thorough understanding of various embodiments of the invention. Certain well-known details are not set forth in the following disclosure, however, to avoid unnecessarily obscuring the various embodiments of the invention. Those of ordinary skill in the relevant art will understand that they can practice other embodiments of the invention without one or more of the details described below. Also, while various methods are described with reference to steps and sequences in the following disclosure, the description is intended to provide a clear implementation of embodiments of the invention, and the steps and sequences of steps should not be taken as required to practice the invention.

Basic CEST Pulse Sequence

The basic pulse sequence used in the CEST techniques described below comprises two building blocks: (1) a highly frequency selective variable duration saturation pulse train with a number of identical shaped RF pulses and short delays and (2) a set of RF spoiled GRE acquisition segments. For the CEST saturation building block, saturation pulse frequency offset, the total duration of the saturation pulse train, the individual duration of the pulses in the train, the RF duty cycle of the pulse train, and two choices for shapes of the individual RF pulses (Rectangle or Hamming windowed rectangle), all may be chosen by the user. For the acquisition building block, the RF flip angle, acquisition bandwidth, FOV, image matrix size and the number of shots to use to collect one image also may be chosen by the user. The number of segments per shot are calculated as image matrix size divided by the number of shots.

The two building blocks are nested in the following pseudocode implemented on the MR scanner including looping structure to provide reliable CEST images:

```
For ishot = 1:n shots:
    Wait for gating signal if needed;
    Use saturation building block with +ve offset frequency;
    For isegment = 1:n segments:
        Acquire echoes for image series 1 (+ve frequency saturated image);
    End isegment loop;
    Long Delay to allow for T1 recovery;
    Wait for gating signal if needed;
    Use saturation building block with -ve offset frequency;
    For isegment = 1:n segments:
        Acquire echoes for image series 2 (-ve frequency saturated image);
    End isegment loop
    Long Delay to allow for T1 recovery;
End ishot loop.
```

The following table summarizes the applications and a set of saturation train parameters developed using the above approach that yielded good CEST contrast images. Further optimization is still possible to improve CEST contrast.

| Metabolites | Frequency offset (ppm) | Peak B1 | Duration (second) | Diseases conditions | Saturation pulse train parameters |
|---|---|---|---|---|---|
| Glutamate | 3 ppm | 250 Hz | 1 second | Epilepsy, seizures, Alzheimer's disease, Multiple Sclerosis, Trauma, brain tumors | 10 pulses, 100 ms duration, Hanning windowed rectangle |
| γ-amino butyric acid (GABA) | 2.75 ppm | 250 Hz | 1 second | Epilepsy, Seizures, Alzheimer's disease | 10 pulses, 100 ms duration, Hanning windowed rectangle |
| Glycine | 2.85 ppm | 300 Hz | 1 second | Spinal cord injuries | 10 pulses, 100 ms duration, Hanning windowed rectangle |
| Phospho-creatine (PCr) | 2.5 ppm | 150 Hz | 10 seconds | Heart Ischemia, Brain tumor | 100 pulses, 100 ms duration, Hanning windowed rectangle |
| Adenosine tri-phosphate (ATP) | 2.0 ppm | 150 Hz | 10 seconds | Heart Ischemia, Brain tumor | 100 pulses, 100 ms duration, Hanning windowed rectangle |
| Creatine | 1.8 ppm | 150 Hz | 3 seconds | Heart Ischemia, Brain tumor | 30 pulses, 100 ms duration, Hanning windowed rectangle |
| Myo-Inositol (MI) | 0.63 ppm | 50 Hz | 10 seconds | Multiple Sclerosis, brain tumors, Alzheimer's disease, bipolar disorder, Chronic hepatic and hypoxic encephalopathy, diabetes mellitus, alcohol cytotoxicity | 100 pulses, 100 ms duration, Hanning windowed rectangle |

Additionally Liver CEST imaging using CEST from a mixture of proline, alanine, and aspartate has been performed at 3T by using a saturation pulse train at the frequency offset of 2.75 ppm using the following parameters: peak B1 = 300 Hz, duration = 250 ms. For saturation, 5 pulses of 50 ms duration are used with a Hanning windowed rectangle option.

As exemplified by the above table, the inventors have discovered the CEST effect for various neurotransmitters and energy metabolites in the brain and muscles and various endogenous metabolites in the liver and have identified how MR imaging of the CEST effect may be used to monitor the concentration of the metabolite and hence to characterize and monitor various disease states in the body correlated to the concentration of the metabolite. By adjusting the timing, amplitude, and length of the RF pulse as well as other parameters of the CEST pulse sequence to address the unique chemical shifts and exchange rates of the target, new targets with unique characteristics may be acquired using CEST MR imaging. Several examples of such techniques are described below.

MR Imaging of Brain Metabolites Via CEST

The inventors have discovered the CEST effect in endogenous metabolites (glutamate, gamma-aminobutyric acid (GABA), glycine, and myo-inositol (MI)) present in the central nervous system (CNS). While the CEST effect has been detected in an array of molecules, it is believed that there have been no CEST studies on these molecules.

Glutamate and GABA are the major amino acid neurotransmitters in the brain. The concentration of these metabolites in the brain is relatively high (~a few mM). Glutamate is responsible for fundamental processes such as memory and sensory perception. In excess, it triggers a cascade of negative reactions associated with neurologic diseases such as multiple sclerosis (MS), Parkinson's disease, stroke, ALS (amyotrophic lateral sclerosis or Lou Gehrig's disease) and Alzheimer's disease. Excitotoxic destruction due to excess of glutamate also facilitates growth of brain tumors.

GABA is the major inhibitory neurotransmitter in the central nervous system (CNS). Excessive GABA levels appear to contribute to migraines, cerebrovascular disease, and other neurological disorders. Conversely, a deficiency in GABA is associated with anxiety symptoms, irritability, headaches, hypertension, palpitations, and seizures.

Glycine plays multiple functions in the CNS. It acts as the primary neurotransmitter in charge of inhibitory synaptic transmission in the brain stem and spinal cord as well as an excitatory neurotransmitter at glutamatergic synapses. Elevated levels of Glycine have been observed in Amyotrophic Lateral Sclerosis (ALS) as well as in brain tumors where Glycine possibly represents a marker for tumor malignancy.

MI is involved in several cellular processes in the CNS. It is perhaps best known for its role in intracellular signal transduction. As a precursor of phospholipids and phosphoinositides, MI is also involved in cell membrane structure, adhesion, growth, vesicular trafficking, and survival. Increased MI has been reported in patients with brain tumors and Alzheimer's disease.

Measurement of changes in concentration of these functional biomarkers in various disease conditions is crucial in clinical management, therapeutic response monitoring, and drug development. However, the detection of these metabolites in-vivo is challenging. MR spectroscopy (MRS) has been widely used to detect these metabolites in various disease conditions. However, MRS has poor spatial resolution and is often relegated to measurement of a single voxel. Furthermore, proton peaks from these metabolites have complicated coupling patterns that overlap with peaks from other metabolites and hence require special spectral editing methods to detect these signals. This will also lead to further losses in the SNR of the metabolite of interest. CEST imaging on the other hand can potentially detect sub mM concentrations over large areas with substantially higher resolution. The small metabolites described in this section (glutamate, gamma-aminobutyric acid (GABA), glycine, and myo-inositol (MI)) have concentrations of several mM in-vivo and their exchangeable protons have distinct chemical shifts (glutamate, glycine, GABA, and MI at 3.0, 2.85, 2.7 and 0.625 ppm, respectively). No other significant metabolites in brain have such CEST frequencies and thus the CEST contrast from these molecules will be highly specific to the respective metabolites and provide a new outlook in diagnosis and treatment of related brain pathology.

These metabolites may be detected using MRS and MRI via magnetization exchange of protons. Such methods and processes can be used in diagnosis and treatment monitoring of related brain disorders. In addition, pH dependent contrast from these agents can potentially provide microenvironment information about local brain tissue, such as pH changes caused by stroke, tumors, etc.

Figure 2:
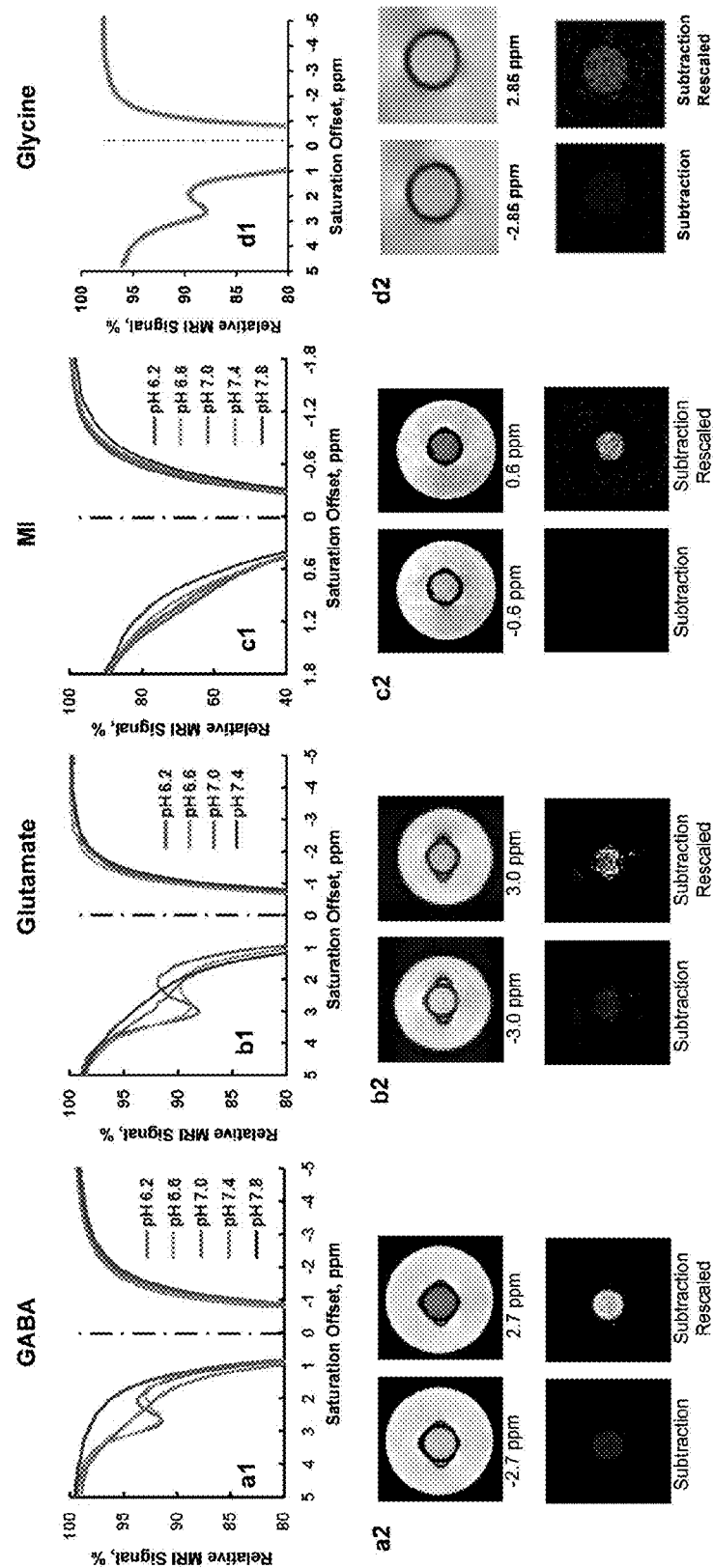
FIG. 2 demonstrates CEST in the form of z-spectra (with a dip representing the chemical exchange site of exchangeable protons) as well as CEST contrast images for each respective metabolite.
Figure 3:
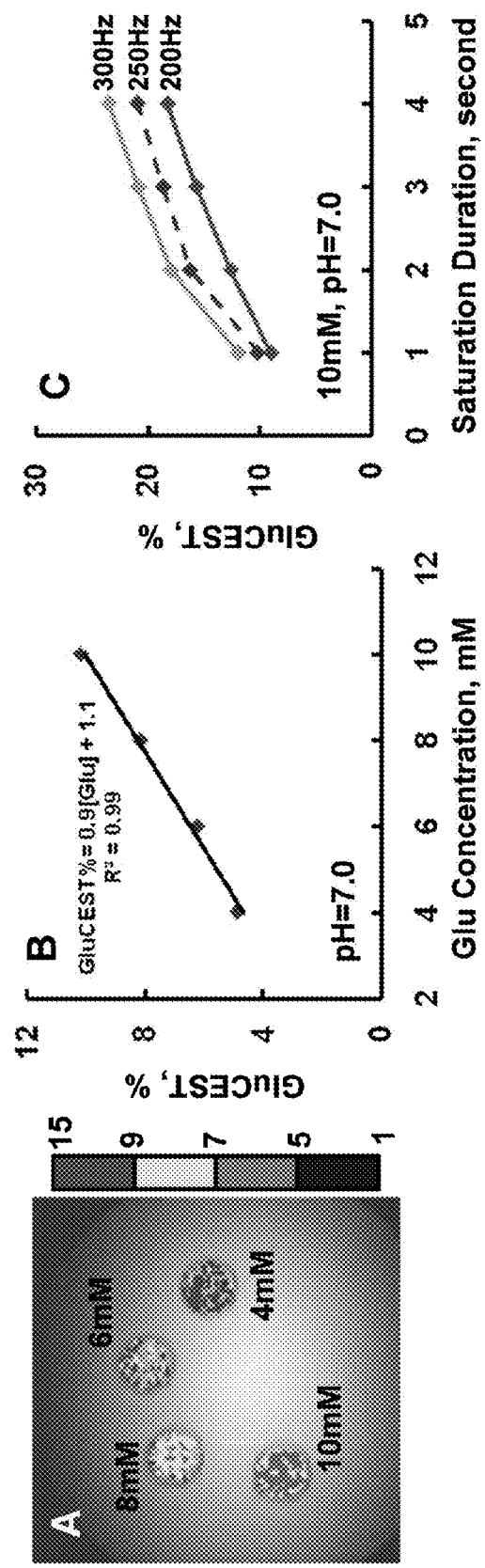
FIG. 3A illustrates CEST contrast from glutamate at different concentrations and pH 7.0.
FIG. 3B illustrates the 4.86±0.24% to 10.2±0.26% change in the CEST effect observed from 4 mM to 10 mM glutamate.
FIG. 3C shows the increase in glutamate CEST effect with increased peak $B_1$ amplitude and duration of pre-saturation pulse.

The CEST effect of these metabolites has been observed both in phantom studies as well as in vivo studies. FIG. 2 demonstrates this CEST in the form of z-spectra (with a dip representing the chemical exchange site of exchangeable protons) as well as CEST contrast images for each respective metabolite. Also shown are images acquired at 7T by applying a long saturation pulse at the frequency of the exchangeable protons as well as the same frequency offset on the opposite of the water resonance and the difference between these images. This subtraction images demonstrates the CEST effect with the effects of direct water saturation removed.

Along with demonstrating the CEST effects for each of these metabolites, the inventors also observed the concentration dependence of this effect. CEST contrast from glutamate at different concentrations and pH 7.0 is shown in FIG. 3A. The glutamate CEST effect is linearly proportional to the glutamate concentration in the measured range. With imaging parameters that are suitable in vivo studies, the inventors observed a 4.86±0.24% to 10.2±0.26% change in the CEST effect from 4 mM to 10 mM glutamate (FIG. 3B). This demonstrates that the glutamate CEST effect can serve as an index of glutamate concentration. FIG. 3C shows the increase in glutamate CEST effect with increased peak $B_1$ amplitude and duration of pre-saturation pulse. Z-spectra acquired with glutamate solutions at varying pH showed that the glutamate CEST effect is also sensitive to pH (FIG. 2a1). At a low pH, the exchange rate decreases and a narrow CEST peak is observed. While at higher pH, progressive broadening of the CEST peak was observed due to faster exchange. Since the intracellular pH (pHi) in the brain of normal healthy volunteers is reported around 7.0, the CEST contrast of glutamate at this pH is the most relevant for in vivo imaging. At pH 7.0, the inventors observed a broadened CEST peak with significant asymmetry in the Z-spectrum. It is important to note that despite the relatively broad glutamate CEST peak (between 2-4 ppm) at physiological pH the selective saturation at +3.0 ppm provides a significant water signal decrease and clear glutamate CEST effect. Similar pH and Concentration effects have been shown for GABA, MI, and glycine as well.

Figure 4:
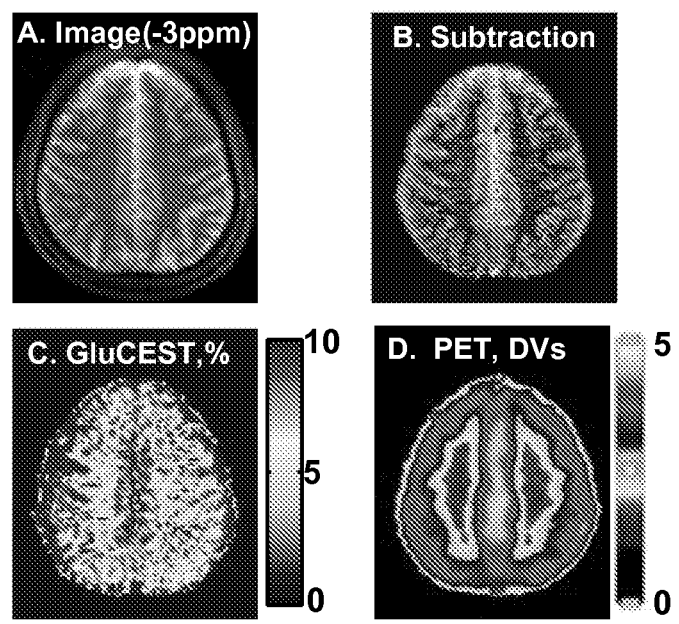
FIG. 4 shows the glutamate CEST map in a healthy human brain and comparison with a similar PET image.

The CEST effects of these metabolites have also been demonstrated. FIG. 4 shows the glutamate CEST map in a healthy human brain and comparison with a similar PET image. It was seen that the physiological concentration of glutamate (Glu) varies in different regions of the brain. These images were compared with PET images of the Glu receptor (mGluR5, $^{11}$C-ABP688)(18) [FIG. 4D]. Comparison of CEST contrast images with the comparable section of the PET image shows that the GluCEST distribution is quite similar to the distribution of the mGluR5 receptor, indicating that GluCEST image reflects Glu distribution in the human brain. Again, similar in vivo brain maps have been shown for MI and GABA.

As discussed above, these metabolites have a potential role in a majority of brain disease conditions. The CEST contrast from these small molecules will provide a new avenue of diagnosing and monitoring disease conditions. The pH dependent change in their proton exchange may also provide another potential method for in-vivo detection of pH in the brain. The methods of the invention will be useful in monitoring various disease conditions related to these metabolites.

CEST properties of glutamate, GABA, glycine and MI discovered by the inventors can produce specific detection of these metabolites without overlapping with other metabolites. Since CEST imaging maps the metabolites via bulk water signal, it can provide high spatial resolution maps of metabolites comparable to that of proton imaging. Furthermore, CEST imaging contrast can be easily turned "on" and "off" by simply changing the imaging parameters and imaging post-processing is relatively simple. The direct subtraction of the two images with contrast "on" and "off" can provide reliable quantification of these important metabolites. Brain micro-environment information such as pH can also be deduced from these pH responsive endogenous CEST contrast agents.

MR Imaging of Energy Metabolites (ATP and PCr) Via CEST

Adenosine tri-phosphate (ATP) and phosphor-creatine (PCr) are the major energy sources/reservoirs in the biological system. The concentration of ATP and PCr is varied in the different organs. The ATP concentration in brain, heart, and muscle is ~3-4 mM, ~6 mM and ~10 mM, respectively. On the other hand, PCr, which is a major source of energy reservoir, has concentrations of 5-6 mM in the brain, 10 mM in the heart, and around 33.5 mM in muscles. Alternations of these energy-rich compounds have been reported in various disease conditions including tumors, heart infarction, and muscular disorders.

$^{31}$P MRS has been widely used to detect the signal from these metabolites. However, due to low SNR of phosphorous MRS, only signals from a large voxel up to ~8 cc can be detected. A high number of signal averages is also required resulting in a long imaging duration, typically >10 minutes. Phosphorous imaging of PCr has been previously reported utilizing MT effects between Pi and PCr, which has a very low resolution. So far, there is no known imaging technology that can map these metabolites in-vivo with high resolution and sensitivity.

The invention also provides high resolution mapping of the energy metabolites PCr and ATP using the CEST techniques by exploiting their amine (~NH2) protons. This technology can potentially image the metabolic rate of these metabolites in a biological system in-vivo with a high resolution of ~1 micro-cc in a short period of imaging time (~1 minute). The high sensitivity of CEST imaging can potentially detect <1 mM metabolite. However, the inventors are not aware of any study of CEST imaging of energy-rich compounds, such as ATP and PCr.

The concentrations of ATP and PCr are several mM in-vivo and their exchangeable protons have distinct chemical shifts (amine groups on PCr and ATP resonate at 2.5 ppm and 2 ppm, respectively). The inventors have developed new methods and processes for detection of these metabolites using MRI that can be used in diagnosis and treatment monitoring of a multitude of disorders. In addition, pH dependent contrast from these agents can potentially provide microenvironment information about local brain tissue such as pH changes caused by stroke, tumors, etc.

The CEST effect of these metabolites at different concentrations has been observed in phantom studies. Phantom CEST spectral data from ATP and PCr have been obtained to characterize the CEST effect. Phantom CEST images have been acquired at various concentrations of ATP at 7T and PCR at both 3T and 7T MRI systems. The inventors have also obtained the high resolution PCr CEST image from the human calf muscles at 7T, and a change in the PCr CEST contrast was noted after exercise. In-vivo and in-vitro data are shown in FIGS. 5-10.

Figure 5:
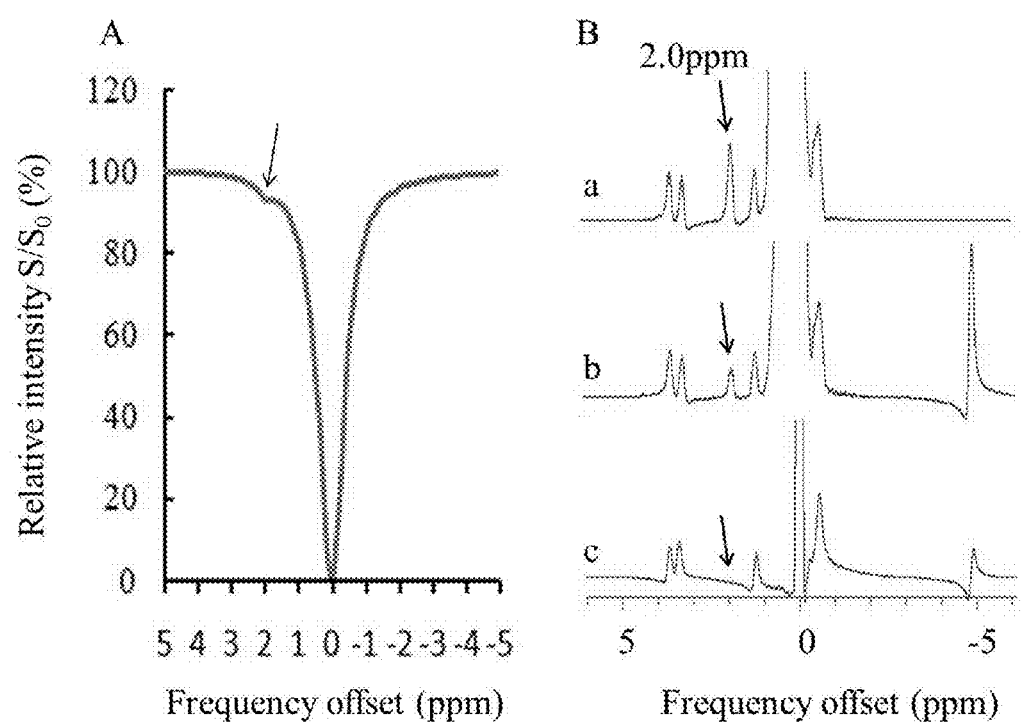
FIG. 5 illustrates that z-spectra from 50 mM ATP shows a CEST effect at 2.0 ppm downfield to the bulk water resonance (A, arrow).

FIG. 5 illustrates that z-spectra (1 second pre-saturation and 127 Hz B1, 9.4T) from 50 mM ATP shows a CEST effect at 2.0 ppm downfield to the bulk water resonance (A, arrow). NMR spectra from 50 mM ATP solution shows an exchangeable peak at 2.0 ppm downfield to the bulk water (B, a). After addition of 50% $D_2O$, the amplitude of the peak decreases at (b) and disappears after addition of 99.9% $D_2O$ at (c). The peak present at the 2.0 ppm is from ATP —NH2.

Figure 6:
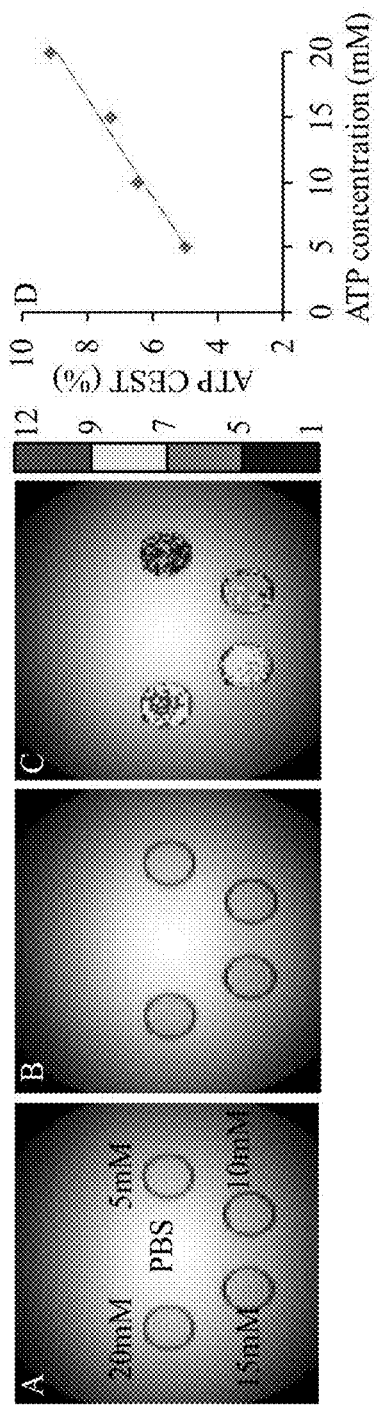
FIG. 6 illustrates a phantom containing tubes with different concentrations of ATP (pH 7.4) in a phosphate buffer solution (PBS) and the CEST image from the phantom.

FIG. 6 illustrates a phantom containing tubes with different concentrations of ATP (pH 7.4) in a phosphate buffer solution (PBS) and the CEST image from the phantom. Images were collected at a 10 second duration and 150 Hz amplitude pre-saturation RF pulse, which was frequency selected at ±2.0 ppm (A, B). Subtraction of the two images shows CEST contrast only from ATP, while no signal from PBS due to the symmetric saturation at (C). The ATP signal overlay on the CEST image obtained at −2.5 ppm is shown at (D). FIG. 6B reflects the linear dependence of ATP CEST effect on ATP concentration. The experiment was performed using a Siemens 7T whole body research scanner.

Figure 7:
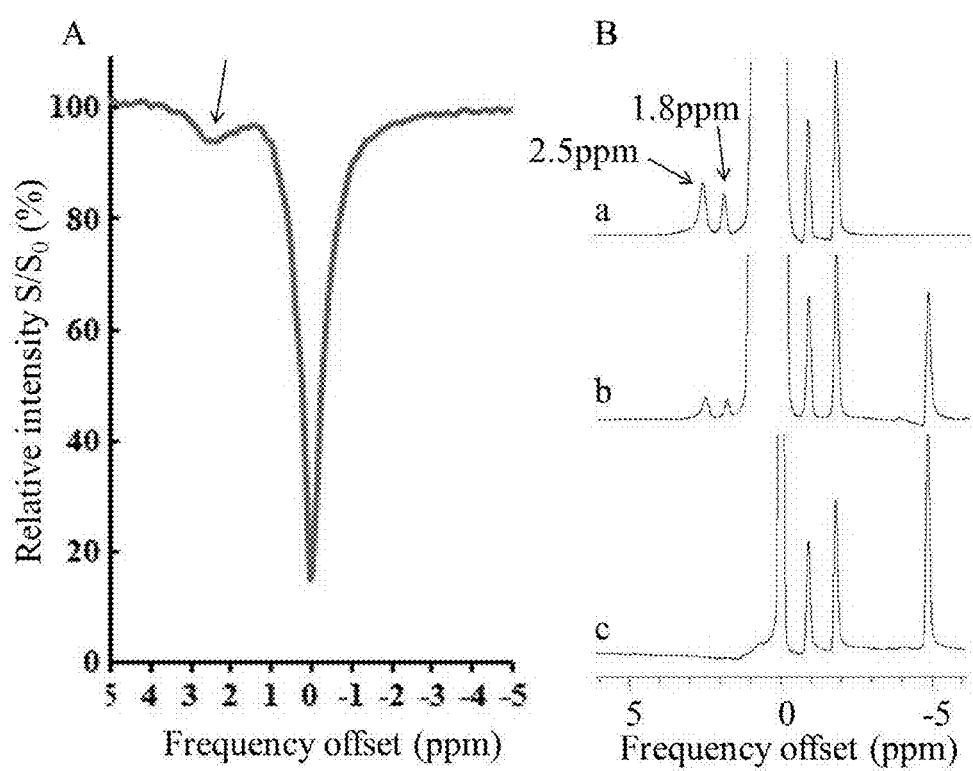
FIG. 7 illustrates that z-spectra from 100 mM PCr shows a CEST effect at 2.5 ppm downfield to the bulk water resonance (A, arrow) and a normal MRS spectrum (B).

FIG. 7 illustrates that z-spectra (1 second pre-saturation and 127 Hz B1, 9.4T) from 100 mM PCr shows a CEST effect at 2.5 ppm downfield to the bulk water resonance (A, arrow) and a normal MRS spectrum (B). NMR spectra from 100 mM PCr solution shows the two peaks at 1.8 and 2.5 ppm downfield to the bulk water (B, a). After addition of 50% $D_2O$, the amplitude of both peaks decreases at (b) and they completely disappear after addition of 99.9% $D_2O$ at (c), indicating that these resonances are from two exchangeable groups. The peak present at the 1.8 ppm is from creatine-HN2 as in water PCr rapidly hydrolyzes in to the creatine. The other peak at 2.5 ppm is from PCr-HN2.

Figure 8:
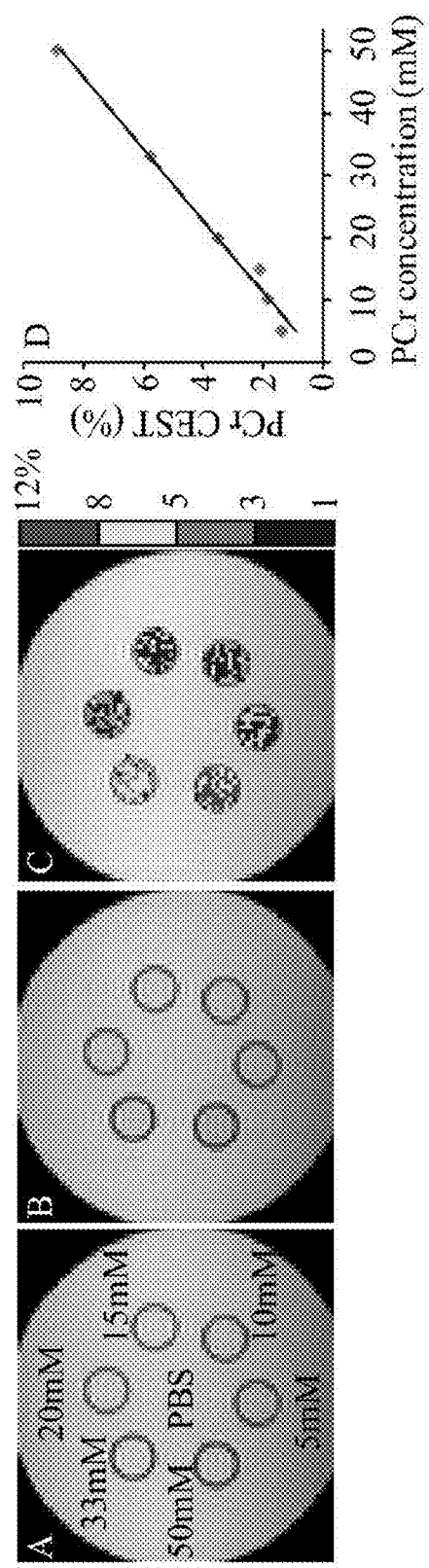
FIG. 8 illustrates a phantom containing tubes with different concentrations of PCr (pH 7.4) in PBS and the CEST image from the phantom obtained at 3T.

FIG. 8 illustrates a phantom containing tubes with different concentrations of PCr (pH 7.4) in PBS and the CEST image from the phantom obtained at 3T. 3T MRI CEST images were collected with a 10 second duration and 150 Hz amplitude pre-saturation RF pulse, which was frequency selected at ±2.5 ppm (A, B). Subtraction of the two images shows CEST contrast only from PCr, while no signal from PBS due to the symmetric saturation at (C). The PCr signal overlay on the CEST image obtained at −2.5 ppm is shown at (D). FIG. 8B reflects the linear dependence of PCr CEST effect on PCr concentration. The experiment was performed using a Siemens 3T clinical scanner.

Figure 9:
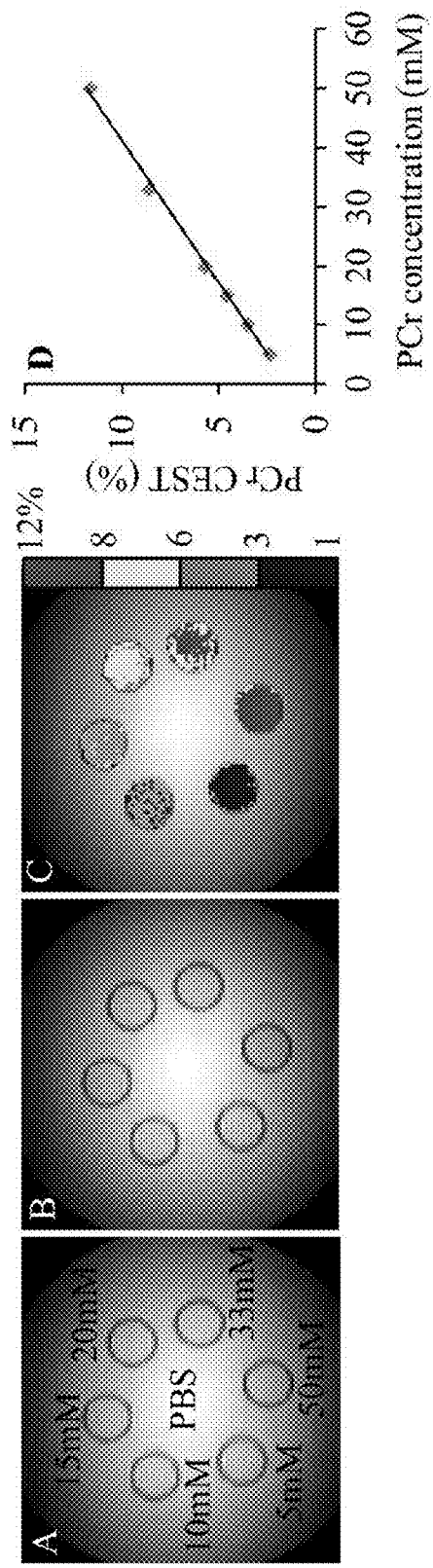
FIG. 9 illustrates the same phantom as in FIG. 8 and CEST images obtained at 7T.

FIG. 9 illustrates the same phantom as in FIG. 8 and CEST images obtained at 7T. The experiment was performed using a Siemens 7T whole body research scanner. As illustrated, at 7T, the CEST effect is higher than at 3T.

Figure 10:
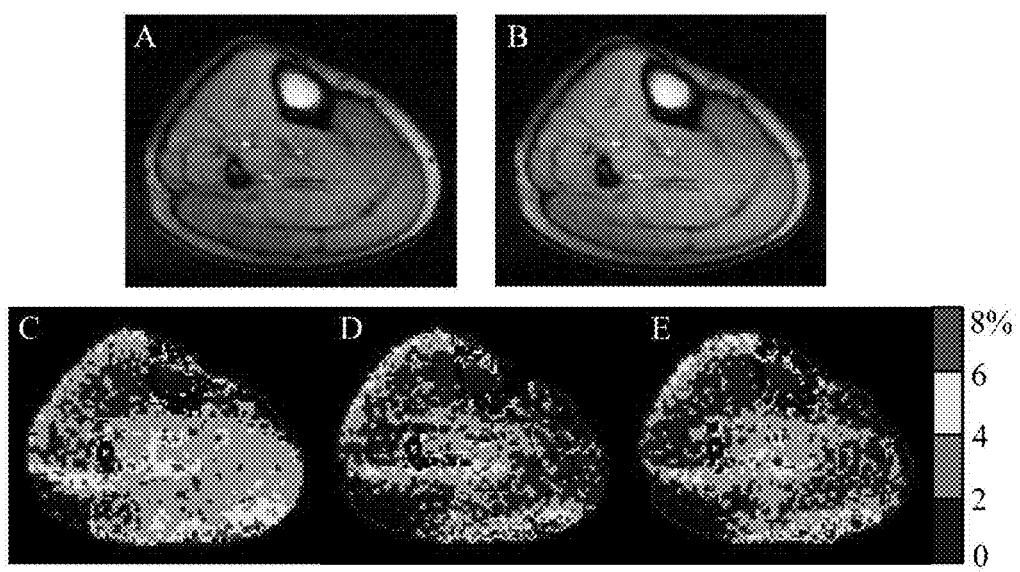
FIG. 10 illustrates CEST imaging in a skeletal muscle at 7T illustrating the two offset images acquired at rest with saturation at +2.5 ppm (A) and −2.5 ppm (B) and CEST contrast images at rest, 1 minute post exercise, and 15 minutes post exercise in FIGS. 10C-10E.

FIG. 10 illustrates CEST imaging in a skeletal muscle at 7T, illustrating the two offset images acquired at rest with saturation at +2.5 ppm (A) and −2.5 ppm (B) and CEST contrast images at rest, 1 minute post exercise, and 15 minutes post exercise in C-E. PCr CEST contrast before exercise is shown in FIG. 10C, which shows a spatial distribution of PCr in the calf muscles. A decrease in the CEST contrast is observed after 10 minute rigorous exercise at (D). Following 2 minutes of exercise, a recovery in the PCr CEST contrast is observed. The experiment was performed using a 7T Siemens whole body research scanner.

The CEST techniques described herein allows one to map the PCr and ATP with high resolution (less than voxel size of 5 mm$^3$) in total imaging time of less than 1 minute. The exchange rates of these proton groups have strong pH dependence in the physiologic range and may be useful as pH reports. The measurement of intracellular pH and pH calibration is also possible by measuring changes in the exchange rate of PCr.

As noted above, CEST imaging contrast can be easily turned "on" and "off" by simply changing the imaging parameters and imaging post-processing is relatively simple. The direct subtraction of the two images with contrast "on" and "off" can provide reliable quantification of these important metabolites.

Sample clinical applications for measuring PCr and ATP in this manner include:
1. Hypertensive heart disease, aortic valve disease, and dilated cardiomyopathy and infracted myocardium as these disease states have shown low concentration of PCr and ATP.
2. Ischemic-hypoxic brain insult, which is characterized by depletion of PCr and ATP.
2. Brain and neck tumors, which include both PCr and ATP concentration changes.

Characterization of Chronic Liver Disease Using CEST MR Imaging

Among chronic liver diseases, cirrhosis and hepatocellular carcinoma represent the foremost causes of death in the United States. It has been estimated that approximately 30,000 deaths occur each year. These statistics are consistent with a steadily increasing mortality rate from malignant hepatoma, owing to the frequency of liver fibrosis and subsequent cirrhosis by a variety of causes. Hepatic fibrosis consists of the accumulation of extracellular matrix (ECM) proteins in liver tissue by fibrogenesis, a wound healing response to injury. Hepatic fibrosis ultimately leads to the development of cirrhosis, nodule formation that can alter hepatic function and blood flow, and is itself a serious risk factor for hepatocellular carcinoma, or HCC. To allow for treatment prior to development of the complications associated with end-stage liver disease, the ability to diagnose and monitor the course of hepatic fibrosis or cirrhosis early on becomes essential. At present, percutaneous liver biopsy is the gold standard for diagnosis and assessment of hepatic fibrosis and cirrhosis. However, hepatic biopsy is an invasive procedure that involves some risk of complication, such as hemorrhage, hospitalization in 3% of cases, and a fatality rate of 0.03%. Patients show poor acceptance of the technique due to pain that often accompanies biopsy procedures. Also, histologic examination of a single liver biopsy results in under-diagnosis in over 30% of cases. The implementation of magnetic resonance imaging (MRI) techniques as a noninvasive means to diagnose and grade hepatic fibrosis is underway. Current MRI techniques in practice and development for assessment of fibrosis include conventional contrast material-enhanced MRI, double contrast-enhanced MRI, MR elastography (MRE), diffusion-weighted (DW) imaging, and MR perfusion imaging. Most of these techniques are still under development, and unfortunately, none of these techniques have shown significant promise for quantifying small changes in fibrosis over time.

Accordingly, there is need for a reproducible and reliable, noninvasive method to evaluate disease progression in patients with chronic liver disease; however, current diagnostic tests and imaging techniques are still limited in their ability to differentiate with accuracy between the different stages of fibrosis. The inventors have discovered a novel non-invasive MRI technique based on chemical exchange saturation transfer (CEST) and magnetization transfer (MT), with the potential to sensitively quantify the grade of hepatic fibrosis at the molecular level. CEST MRI uses an off-resonance saturation pulse at the resonance frequency of exchanging protons to null the signal from exchangeable protons. As noted above, doing so indirectly detects the decrease in bulk water signal through chemical exchange, creating detectable contrast from bulk water. CEST contrast can be turned "on" and "off" by simply changing the saturation RF frequency, which is very suitable for molecular imaging of CEST agents that possess distinct resonance frequencies. CEST contrast can originate from endogenous amide, amine, and hydroxyl protons or from exchangeable sites on exogenous contrast agents. The CEST effect from amide protons of mobile proteins/peptides and glycogen has been reported, and the potential to measure the pH using these amide protons in biological conditions also has been explored.

The inventors have discovered the CEST effect of potential endogenous metabolites related to liver diseases. While CEST effect has been detected in an array of molecules, it is believed that no CEST studies have been conducted on these molecules. Liver CEST imaging protocols were successfully implemented on a 3T clinical scanner. The inventors have demonstrated that the CEST effect can serve as a biomarker to differentiate cirrhosis from normal liver tissues, and combination with MT contrast enables one to differentiate between end-stage liver diseases, such as cirrhosis from carcinoma. CEST molecular imaging thus may be used to diagnose and monitor treatment of chronic liver diseases.

Figure 11:
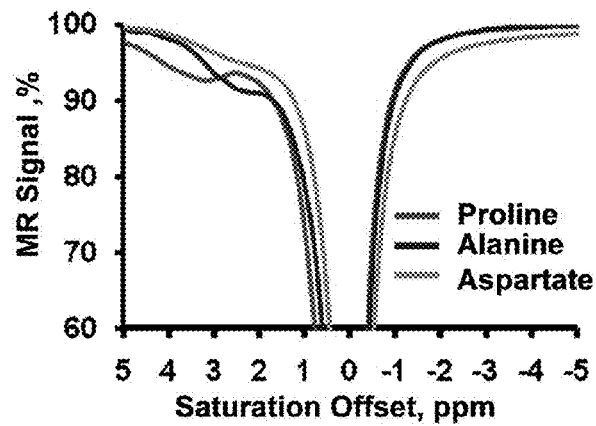
FIG. 11 illustrates z spectra from proline, aspartate, and alanine, where the CEST effect at 3 ppm is clearly seen for proline, the only cyclic amino acid (AA) and the major AA in collagen.

Those skilled in the art appreciate that the liver is the metabolic center of the body, involving almost all aspects of metabolism including carbohydrates, fat, amino acids, and proteins. The inventors have investigated the CEST effect of the metabolic molecule that could be involved in chronic liver diseases. Fibrotic liver is characterized with both quantitative and qualitative changes in composition of the hepatic ECM, especially collagens, fibronectin, entactin, elastin, and laminin. As shown in FIG. 11 (which illustrates the CEST Z-spectra at 9.4T of proline (10 mM, pH 7.0), alanine (10 mM, pH 7.0), and aspartate (10 mM, pH 7.4)), proline, the only cyclic amino acid (AA) and the major AA in collagen, clearly shows CEST effect at 3 ppm. Free proline concentration displays linear correlation with the total collagen content in the liver as previously reported in the art. Alanine aminotransferase (ALT) and aspartate aminotransferase (AST) are the established tests for liver function. Elevation in ALT and AST levels in chronic liver disease will accordingly lead to concentration increase in liver alanine and aspartate, whose CEST effects are located at around 3 ppm, as shown in FIG. 11. Of course, additional liver disease related metabolites, contributing to liver CEST effect at 3 ppm, may also be present.

Figure 12:
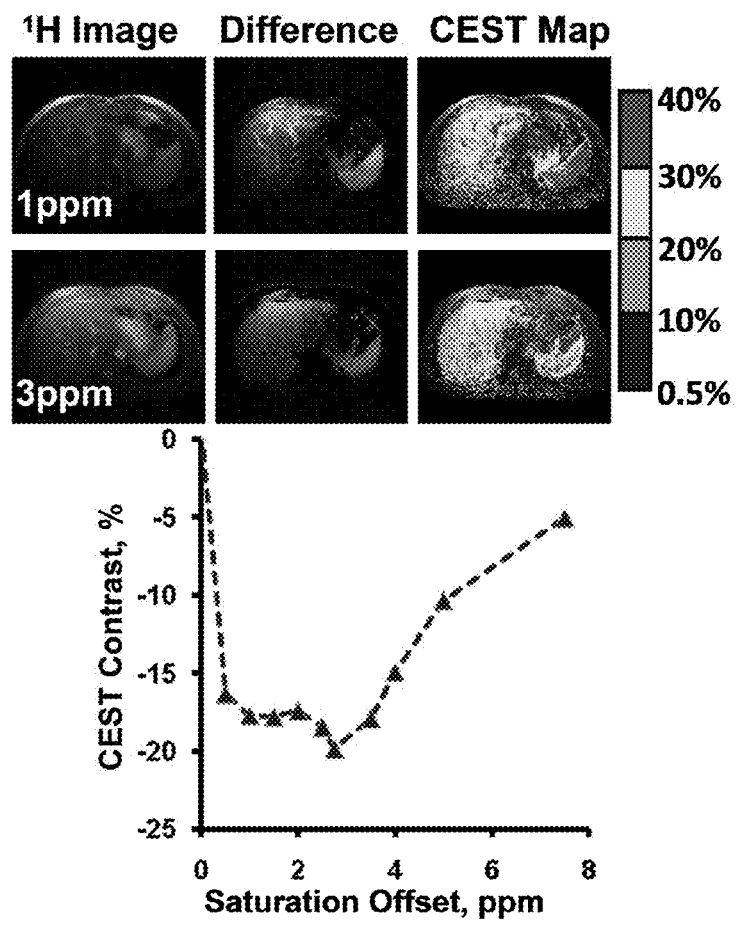
FIG. 12 illustrates a CEST imaging protocol that was successfully implemented on a 3T clinical scanner, showing that in-vivo liver CEST imaging demonstrated significant effects at 1 ppm and 3 ppm.
Figure 13:
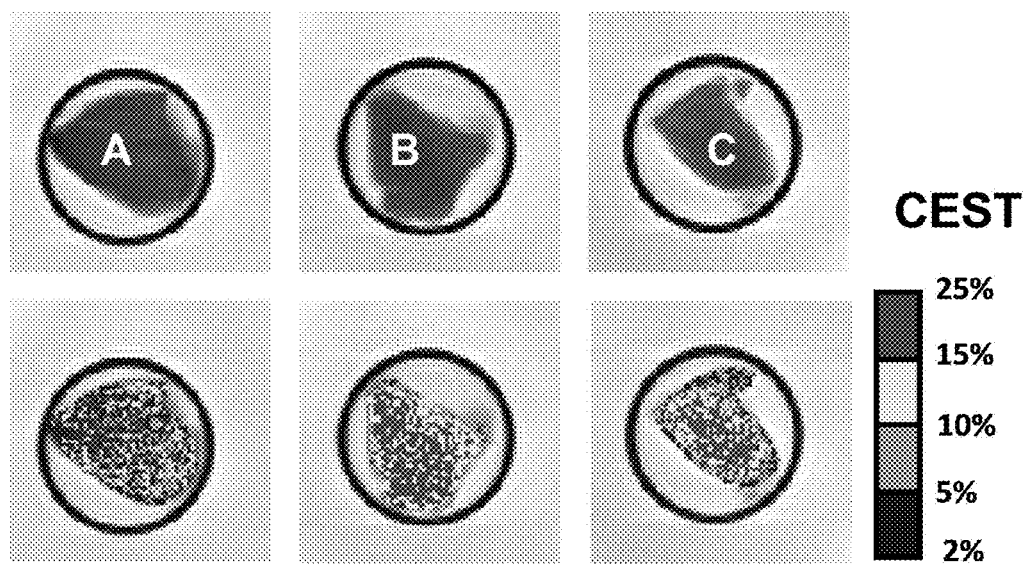
FIG. 13 illustrates studies of both normal and pathological human liver tissues at 7T, illustrating that significantly higher CEST effects were observed from specimens with primary sclerosing cholangitis (16.9±5.3%) and hepatocellular carcinoma (15.3±5.5%), compared to healthy specimens (6.0±3.6%).
Figure 14:
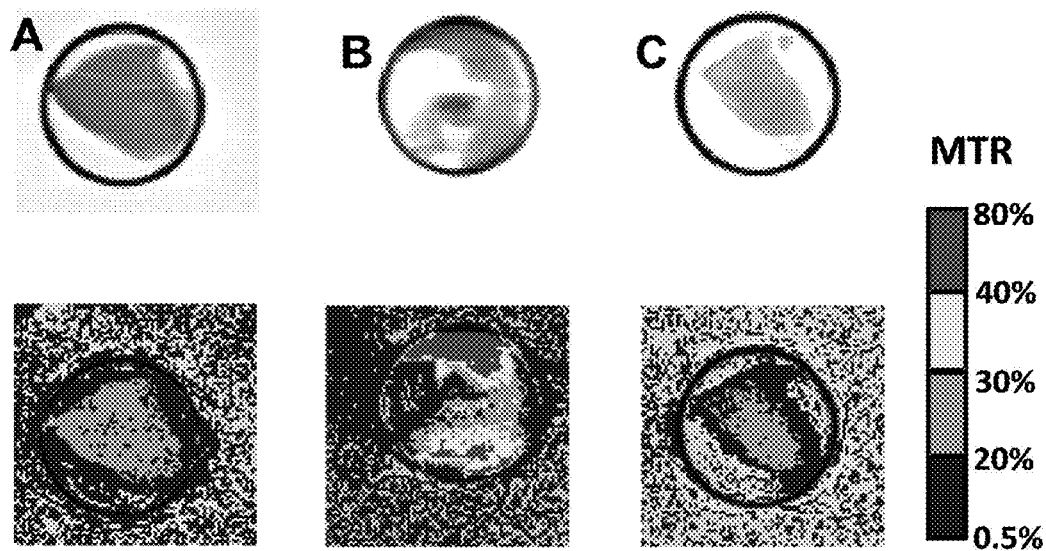
FIG. 14 illustrates that MTR contrast of the sclerosing cholangitis sample was significantly higher than both normal and hepatocellular carcinoma samples.
Figure 15:
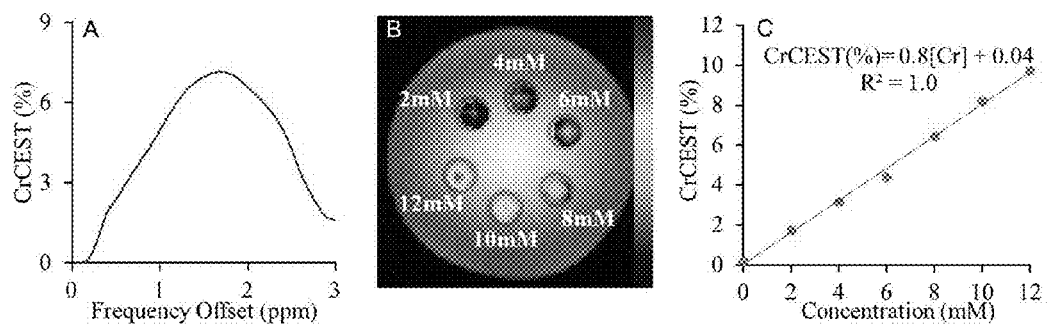
FIG. 15A shows the Z-spectral asymmetry curve from a 10 mM CR phantom measured at 3T.
FIG. 15B shows the CEST contrast from different concentrations of Cr, which correlate linearly with Cr concentration as shown in FIG. 15C.
Figure 16:
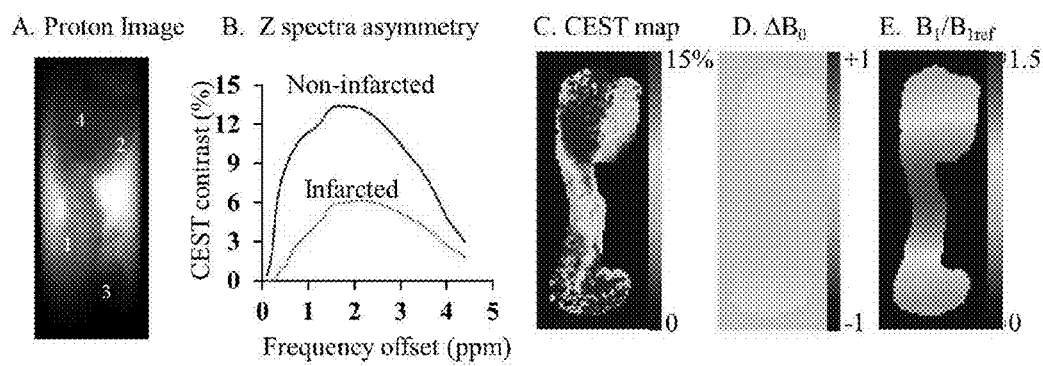
FIG. 16A shows the anatomical image of a tissue sample at 7T on which two regions are defined: infarcted (1&2) and non-infarcted regions (3&4).
FIG. 16B shows the Z-spectral asymmetry curves from infarcted (region 1) and non-infarcted (region 4) areas as shown in FIG. 16A.
FIG. 16C shows the corresponding CEST map at 1.8 ppm, which shows higher CEST effect in the non-infarcted zone compared to the infarcted region.
FIGS. 16D and 16E show the $B_0$ and $B_1$ ratio maps, which are used to correct the CEST contrast.
Figure 17:
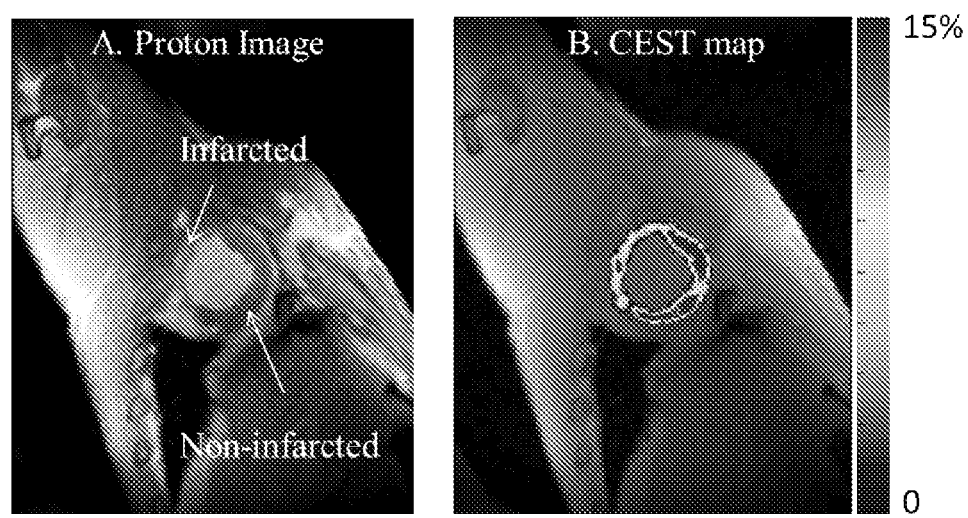

A CEST imaging protocol was successfully implemented on a 3T clinical scanner, where in-vivo liver CEST imaging demonstrated significant effects at 1 ppm (maybe due to glycogen) and 3 ppm (maybe due to proline, alanine and aspartate), as shown in the in-vivo CEST maps at 3T illustrated in FIG. 12. In-vivo liver Z-spectra displayed two specific CEST peaks at those frequency offsets. FIG. 13 shows 7T CEST MRI of liver tissue samples for both normal (FIG. 13A) and pathological human liver tissues at 7T (primary sclerosing cholangitis stage V—FIG. 13B—and hepatocellular carcinoma—FIG. 13C). As illustrated in the CEST contrast maps at the bottom of FIG. 13 (at 3 ppm color-coded and overlaid on the $^1$H images at the top of FIG. 13), significantly higher CEST effects were observed from specimens with primary sclerosing cholangitis (16.9±5.3%) and hepatocellular carcinoma (15.3±5.5%), compared to healthy specimens (6.0±3.6%). CEST effects were similar between primary sclerosing cholangitis and hepatocellular carcinoma tissues. Interestingly, as illustrated in FIG. 14, MTR contrast of the sclerosing cholangitis sample was significantly higher than both normal and hepatocellular carcinoma samples, which is similar to that has been previously reported. In particular, FIG. 14 shows MT MRI of liver tissue samples for both normal (FIG. 14A), primary sclerosing cholangitis stage V (FIG. 14B), and hepatocellular carcinoma (FIG. 14C). MTR contrast maps at the bottom of FIG. 14 at 20 ppm are color-coded and overlaid on the $^1$H images at the top of FIG. 14. Thus, the combination of liver CEST and MTR contrast could serve as a new comprehensive biomarker for staging the whole course of chronic liver disease development.

It is of great value clinically to accurately assess the stage of fibrotic liver disease for a number of reasons. Patients with substantial fibrosis should be treated efficiently to circumvent the progression to cirrhosis and its host of complications. Staging the progression of liver fibrosis not only suggests the severity of liver disease, but also monitors the response to treatment by conventional drugs and new drugs under development. In patients with chronic hepatitis C or chronic hepatitis B, quantification of fibrosis by liver biopsy is recommended before beginning antiviral therapy as well as following treatment. Current diagnostic tests and imaging techniques are still limited in their ability to differentiate with accuracy between the intermediate stages of fibrosis.

CEST contrast can be used for grading liver fibrosis and cirrhosis because it measures the enhancement of liver disease related metabolites (such as proline, albumin, alanine and aspartate) directly. While CEST contrast can be used to stage fibrosis and cirrhosis, magnetization transfer (MT) effect can help to differentiate cases of HCC from cirrhosis, where CEST effect is similar.

CEST molecular imaging of the liver is advantageous as it directly measures the metabolites associated with liver physiology and pathology, and has the potential to monitor liver metabolism and disease progression. CEST imaging requires no administration of exogenous imaging contrast agents. It can provide images with and without contrast at a single time point, thereby eliminating motion artifacts during the imaging process. MT contrast can be used to differentiate cases of HCC from cirrhosis as previously reported. The combination of CEST and MT contrast may accurately grade and stage chronic liver disease progression from early fibrosis to cirrhosis and HCC.

CEST Based Contrast in Myocardial Tissue (CrCEST)

It is important to distinguish non-infarcted viable myocardial tissue from infarcted tissue in order to determine preoperatively the benefit of a revascularization procedure. Dysfunctional, but viable myocardium has potential for contractile recovery after reperfusion. There are several non-invasive methods for assessing myocardial ischemia and viability including positron emission tomography, single-photon-emission computed tomography, dobutamine stress echocardiography, and cardiovascular magnetic resonance imaging (MRI). Developments over the past two decades have established MRI and MR spectroscopy (MRS) as powerful techniques for investigation of cardiac dynamics, morphology, and bioenergetics. Magnetization transfer (MT) imaging studies have shown less MT ratio in the infarcted region compared to non-infarcted region. Also, delayed gadolinium (Gd) enhanced MRI shows promising results in revascularization. However, none of these techniques can provide the bioenergetics information in infarcted myocardial tissues. On the other hand, phosphorus ($^{31}$P) MRS has been used to detect high energy phosphates and to study myocardial creatine kinase (CK) kinetics. However, phosphorus ($^{31}$P) MRS is limited to low resolution and cannot map tissue heterogeneity for bioenergetics after myocardial infarction at high resolution.

In another embodiment of the invention, the inventors have applied the CEST techniques described herein to image the CEST contrast arising from exchangeable protons (—NH, —NH2 and —OH) from different metabolites present in the myocardial tissue as they vary between normal and infarcted regions. As will be explained below, cardiac CEST MRI provides a new methodology for imaging such pathology. For example, cardiac CEST MRI may be used to noninvasively measure creatine (Cr) concentration, which allows for distinguishing viable from infarcted areas as viable myocardium tissue contains around 28 mM total creatine which is decreased by half in the infarcted areas. Accordingly, in this embodiment, a method is described for mapping the Cr changes in myocardium at high special resolution and to differentiate the infarcted from non-infarcted myocardium regions using a creatine CEST technique (CrCEST). As will be appreciated by those skilled in the art, such methods and processes can be used in diagnosis and treatment monitoring of myocardial infarction. Moreover, CrCEST provides over 500-fold higher sensitivity over typical MRS methods in measuring Cr content in myocardial tissue. This high sensitivity of the method can be exploited to map the Cr content at high spatial resolution in the myocardium, which not only provides the information about Cr heterogeneity in tissues, but also differentiate the infarcted from non-infarcted regions.

FIG. 15A shows the Z-spectral asymmetry curve from a 10 mM CR phantom measured at 3T, and FIG. 15B shows the CEST contrast from different concentrations of Cr, which correlate linearly with Cr concentration as shown in FIG. 15C. All the in vitro imaging experiments were performed on a 7T Siemens whole-body (Siemens Medical Solutions, Malvern, Pa.) with a custom built solenoidal coil. The study included both Cr phantoms as well as tissue heart samples from a chronic left ventricular myocardial swine model obtained post mortem. The swine underwent a surgical procedure tethering the circumflex artery. Following sacrifice, at 4 weeks, tissue samples from chronic, left ventricular myocardial infarction swine heart tissue samples (n=3) were obtained and kept in normal saline. Infarcted and non-infarcted (less or negligible infarction) regions were identified on tissue samples.

FIG. 16A shows the anatomical image of a tissue sample at 7T on which two regions are defined: infarcted (1&2) and non-infarcted regions (3&4). FIG. 16B shows the Z-spectral asymmetry curves from infarcted (region 1) and non-infarcted (region 4) areas as shown in FIG. 16A. As illustrated, the asymmetry curves peak at ~1.8 ppm. This suggests that the observed CEST contrast in myocardial tissue is from creatine which shows the CEST peak at ~1.8 ppm. The infarcted region shows decrease in CEST contrast due to decreased Cr concentration. It has already been reported that myocardium infarction results in decreased Cr concentration by half and it can be observed that there is almost a 50% decrease in CEST contrast. Further, decrease in pH (~0.8-1 unit pH) has been shown in the infarcted region, and it is observed that low pH results in decreased CEST contrast from Cr. FIG. 16C shows the corresponding CEST map at 1.8 ppm, which shows higher CEST effect in the non-infarcted zone compared to the infarcted region. FIGS. 16D and 16E show the $B_0$ and $B_1$ ratio maps, which are used to correct the CEST contrast. Some areas of infarcted tissue show the intermediate range of CEST contrast which can be defined as the dysfunctional but viable regions and having the potential for revascularization.

In vivo myocardial CEST imaging was performed on the swine animal model of acute myocardial infarction using a 3T Siemens whole-body MRI scanner (Siemens Medical Solutions, Malvern, Pa.). FIG. 17A shows the anatomical image from a swine animal model of acute myocardial infarction. On the anatomical image, the infarcted region shows higher signal intensity than the non-infarcted region. The CEST map generated at ~1.8 ppm in FIG. 17B shows higher CEST contrast in the non-infarcted region than the infarcted region. Decreased CEST contrast in the infarcted region is due to the decrease in Cr concentration as well as low pH. The CEST contrast was corrected for the $B_0$ and $B_1$ inhomogeneity.

Those skilled in the art will appreciate that such myocardial CEST imaging can help in distinguishing the myocardial infarcted regions from normal as well as dysfunctional but viable regions. For example, the current embodiment can detect myocardial infarction at resolutions ~1 mm or less. This method uses endogeneous contrast from local Cr levels and does not require any contrast agent injections and hence is safer than studies using exogenous contrast agents such as Gd DTPA. This can be easily implemented on clinical MRI scanners for routine clinical examination of myocardial infarction as well as to monitor the therapeutic response.

Delayed gadolinium (Gd) contrast agent enhanced based imaging is currently in-use to differentiate the infarcted from non-infarcted regions. $^{31}P$ MRS provides the information about the bioenergetics and Cr kinase activity. However, there is no CEST method based imaging technology/products known to the inventors that have been reported for imaging the myocardial infarction and ischemic penumbra (region of myocardium that is partially ischemic and potentially salvageable with timely appropriate intervention). The techniques of the present embodiment improve upon such techniques by demarcating the dysfunctional but viable regions in infarction that have the potential for revascularization (ischemic penumbra) without requiring a contrast agent. Since the technique of this embodiment needs no external contrast agent injection, it is less expensive and safer. Also, the myocardium CEST imaging technique of the invention may be used to determine viable myocardium by inducing stress in the myocardium, which leads to the increased production of creatine. The CEST mapping of the creatine levels may then be used to monitor changes in the creatine levels in response to stress, thus substituting for current stress test protocols (based on exogenous radioligands) for the heart.

The myocardial CEST imaging of this embodiment provides numerous advantages over the prior art techniques, including:

1) The infarcted regions in myocardial tissue can be mapped at high resolution.

2) Based on the Cr concentration and pH changes, the infarcted region can be easily differentiated from ischemic penumbra and non-infarcted myocardial region.

3) The high resolution CEST map can be routinely used in the clinical diagnosis and also to monitor the therapeutic efficacy.

4) This technique may be used in drug discovery/test in animal models of myocardial infarction.

These and other beneficial uses of the myocardial CEST imaging of this embodiment will become apparent to those skilled in the art based on the above descriptions. For example, similar techniques may be applied to skeletal muscle (FIG. 10) to differentiate well perfused from under perfused muscle tissue. In such a case, the image slice would be taken from a subject's skeletal muscle as in FIG. 10 and changes in the concentration of creatine in the subtraction image would be measured to differentiate the well perfused muscle tissue from the under perfused muscle tissue. Also, as with the myocardium, stress could be induced in the muscle tissue prior to monitoring the changes in the creatine levels in response to the stress in the CEST contrast image.

In Vivo Mapping of Brain Myo-Inositol (MICEST)

Myo-Inositol (MI) is one of the most abundant metabolites in the human brain located mainly in glial cells and functioning as an osmolyte. The concentration of MI is altered in many brain disorders including Alzheimer's disease and brain tumors. Currently available magnetic resonance spectroscopy (MRS) methods for measuring MI are limited to low spatial resolution. In accordance with the CEST imaging techniques of the invention, the hydroxyl protons on MI are found to exhibit chemical exchange with bulk water and saturation of these protons leads to reduction in bulk water signal through CEST. The hydroxyl proton exchange rate ($k=600$ s$^{-1}$) is determined to be in the slow to intermediate exchange regime on the NMR time scale (chemical shift $(\Delta\omega)>k$), suggesting that the CEST effect of MI (MICEST) can be imaged at high fields such as 7T ($\Delta\omega=1.2\times10^3$ rad/s) and 9.4T ($\Delta\omega=1.6\times10^3$ rad/s). Using optimized imaging parameters, concentration dependent broad CEST asymmetry between ~0.2 to 1.5 ppm with a peak at ~0.6 ppm from bulk water has been observed. As will be demonstrated below, MICEST detection is feasible in the human brain at ultra-high fields (7T) without exceeding the allowed limits on radiofrequency specific absorption rate. Those skilled in the art will appreciate that the noninvasive approach described herein potentially opens the way to image MI in vivo and to monitor its alteration in many disease conditions.

Myo-Inositol (MI) is one of the most abundant metabolites visible on proton magnetic resonance spectroscopy ($^1$HMRS) of the human brain. MI is a sugar like molecule located mainly in glial cells of the brain, functions as an osmolyte, and its concentration is altered in many brain disorders. During periods of osmotic stress, the osmotic balance is preserved by regulation of MI transport across the plasma membrane. MI is a key precursor of membrane phospho-inositides and phospholipids and it is also involved in cell membrane and myelin sheet structures. Increased membrane turnover or damage to myelin sheets can result in increased concentrations of free MI.

MI is considered to be a glial marker, and an increase in its content is believed to represent glial proliferation. Elevated MI levels have been observed in Alzheimer's disease, gliomatosis cerebri, diabetes mellitus, recovering hypoxia, progressive multifocal leukoencephalopathy, systemic lupus erythematosus, familial hemiplegic migraine, in some patients with canavan disease, and in multiple sclerosis. Further, decreased brain levels of MI were observed in chronic hepatic and hypoxic encephalopathies, stroke, acute thyrotoxic Graves' disease, toxoplasmosis, cryptococcosis, and lymphoma. Castillo et al. measured the MI concentration in different grades of brain tumors and suggested its role in grading of brain tumors (Castillo et al., "Correlation of myo-inositol levels and grading of cerebral astrocytomas," AJNR Am. J. Neuroradiol., Vol., 2, pp. 1645-1649 (2000)).

Currently, $^1$HMRS is the method of choice to quantify MI in vivo. On $^1$HMRS, MI is usually assigned to the peak present at 3.56 ppm. Using MRS, absolute quantification of MI both in gray and white matter has been performed. While some of the studies have shown similar concentration of MI in gray and white matter, other studies using quantitative MR spectroscopy have found higher MI concentrations in the white matter than the gray matter. However, quantification of MI using MRS is limited to low spatial resolution and currently no generally applicable methods for direct MI imaging are available. High-resolution imaging may enable spatial mapping of MI in a multitude of brain disorders related to changes in MI concentration. Given the potential utility of MI and the limitations of currently available approaches, a robust noninvasive imaging method with high spatial resolution for the measurement of MI is highly desirable.

As will be explained below, the high-resolution spatial mapping of MI based chemical exchange saturation transfer (MICEST) of —OH protons residing on MI with bulk water is shown. The pH and concentration dependent MICEST effect is demonstrated on known phantoms. The feasibility of measuring MICEST on healthy human brains in vivo on a 7T ultra high magnetic field MRI scanner is also described. Potential overlap with other metabolites and issues related to the quantification of MICEST in vivo are also described.

All the spectroscopic experiments described below were performed on 9.4 T vertical bore scanner (Inova; Varian, Palo Alto, Calif.) in 5 mm NMR tubes using a 5 mm radiofrequency (RF) probe at room temperature. To explore the presence of exchangeable protons in MI, 200 mM phantoms of MI solutions were prepared in distilled water. The pH was adjusted to 6.0 and 7.0 with 1N HCl/NaOH. $^1$H-spectroscopy of both MI solutions and distilled water were performed with a single pulse acquisition (TR=2 second, number of averages=128). The exchange rate was calculated from the 10 mM MI solution at pH 7.0. Three spectra at +20 ppm and ±0.6 ppm were acquired with varying $B_1$ (from 90 Hz to 1.2 KHz), and varying duration from 0 to 6 seconds. The MICEST contrast was calculated for each $B_1$ and duration. As $B_1$ increases, MICEST contrast increases and reaches a maximum value ($MICEST_{max}$) and then decreases when $B_1$ is too high. The $MICEST_{max}$ value obtained with sufficient $B_1$ along with appropriate duration to accomplish complete saturation was used for the calculation of exchange rate. $T_{1w}$ of the solution was also quantified from the inversion recovery spectrum experiments by varying inversion time (TI) from 50 ms to 6 s. The exchange rate was calculated using Equation 3:

$$k = \frac{MICEST_{max}}{1 - MICEST_{max}} * \frac{1}{f * T_{1w}} \quad [3]$$

MI solutions with different concentrations (2, 4, 6, 8, 10 and 12 mM, pH=7.4) were prepared in small glass tubes (1.5 cm diameter) and immersed in a beaker containing PBS. CEST images from these phantoms were acquired by using a single channel circular polarized transmit-receive head coil on a Siemens whole-body 7.0T clinical MR Scanner (Siemens medical systems, Malvern, Pa.). A new pulse sequence was designed for selective saturation pulse followed by a segmented RF spoiled gradient echo readout sequence. An optimized saturation pulse train with 50, 75 and 100 Hanning windowed rectangular pulses of 100 ms duration each with a 200 μs delay between them was used. The total repetition time of the sequence was adjusted to stay within RF specific absorption rate (SAR) limits. The sequence parameters were: slice thickness=5 mm, GRE flip angle=10°, GRE readout TR=5.6 ms, TE=2.7 ms, field of view=120*120 mm, matrix size=192*192, and one saturation pulse and 64 acquired segments every 16 s. Three CEST images were collected using different saturation pulse durations (4 s, 6 s, and 10 s) and with different peak $B_1$ (50 Hz, 75 Hz, and 100 Hz) at ±0.6 ppm and +20 ppm. The total imaging time was about 15 minutes. In addition, Z-spectra from the same phantoms as well as PBS were acquired over a ±3.0 ppm range relative to the bulk water resonance frequency in steps of 0.1 ppm using the same imaging parameters. Z-spectral data was corrected for $B_0$ and $B_1$ inhomogeneity and normalized with 20 ppm data.

To evaluate the contribution of other major metabolites such as glucose (Glc), glycogen (Gly), creatine (Cr), glutamate (Glu) and γ-amino butyric acid (GABA) to the MICEST, a solution of each metabolite (pH 7.4) in the range of their physiological concentration [Glc (3 mM), Gly (3 mM), Cr (10 mM), Glu (10 mM), GABA (2 mM) and MI (10 mM)] was made and the CEST imaging described above was implemented using similar imaging parameters as described above with varying saturation pulse $B_1$.

To evaluate the CEST contrast dependency on the viscosity and temperature, the CEST imaging of 10 mM MI was performed in three different viscous media i.e. 1%, 2% and 3% agarose, and at two different temperatures (25° C. and 37° C.), using the same imaging parameters as mentioned above. MICEST imaging was also performed in vivo on five healthy volunteers (age: 27-35) using the same transmit-receive head coil and imaging protocols as in the case of phantom MICEST imaging. Only the field of view=240*240 and matrix size=128*128 were different. The CEST imaging was performed at peak $B_1$ of 75 Hz and 6 s saturation pulse duration. Brain Z-spectra were acquired from CEST images with varying saturation frequency from −1.5 ppm to +1.5 ppm and 0.05 ppm steps and the signals were normalized with +20 ppm image. The total imaging time including $B_o$ and $B_1$ mapping was around 35 minutes.

$B_0$ and $B_1$ inhomogeneities in the brain slice were corrected using $B_0$ and $B_1$ maps generated from the same slice. Using the gradient echo images collected at different TE=2.11, 3.17, 4.23, 5.29, 6.35 and 14.8 ms, the $B_0$ map was derived by linearly fitting the accumulated pixel phase $\Delta\theta_0$ following phase unwrapping against the echo time differences ($\Delta$TE).

$$B_0 = \frac{\Delta\theta_0}{\Delta TE} \quad [4]$$

For the $B_1$ map, two images were obtained using preparation square pulses with flip angles $I_1$=30° and $I_2$=60° (pulse duration ττ=1 ms) followed by a spoiler gradient. Flip angle (I) maps were generated by solving Equation [5], $$\frac{\cos(I_2)}{\cos(I_1)} = \frac{S(I_2)}{S(I_1)} \quad [5]$$

where $S(I_1)$ and $S(I_2)$ denote pixel signals in an image with preparation flip angle $I_1$ and $I_2$ respectively. Using the relation $B_1$=I/360τ, the $B_1$ map was generated.

$B_0$ map and multiple CEST data, acquired in the neighborhood of ±0.6 ppm at steps of 0.05 ppm, was used to generate corrected MICEST images (±0.6 ppm) using a procedure similar to that described by Kim et al. in "Water saturation shift referencing (WASSR) for chemical exchange saturation transfer (CEST) experiments," Magn. Reson. Med., Vol. 61, pp. 1441-1450 (2009). Specifically, MICEST data obtained from 0 to ±1.2 ppm with a step size of 0.05 ppm were interpolated using cubic spline to generate CEST data in step size of 0.0125 ppm. Each voxel value of ±0.6 ppm image was replaced by neighborhood MICEST data (0 to ±1.2 ppm) value according to amount of shift in frequency as measured from the $B_0$ map. No change takes place to the voxels of ±0.6 ppm images with frequency shift <0.0125 ppm. The corrected ±0.6 ppm images were then used for computing the final MICEST map. MICEST contrasts were normalized with $B_1/B_{1ref}$ to correct $B_1$ inhomogeneity. RF pulse amplitude for a 30° flip angle was used as $B_{1ref}$.

All image processing and data analysis was performed using MATLAB (version 7.5, R2007b). Original MICEST images (−0.6 and +0.6 ppm) were $B_0$ corrected and MICEST contrast was calculated from the Equation [1] and $B_1$ corrected. MICEST contrast was color coded onto one original image acquired with offset of 0.6 ppm. Segmentation of white and gray matter was performed using a combination of standard fast spin echo T2 and proton density weighted images. A student t-test was performed for MICEST contrast between white and gray matter to see any statistically significant difference. Coefficient of variation of MICEST from each volunteer was calculated as the standard deviation over mean.

Figure 18:
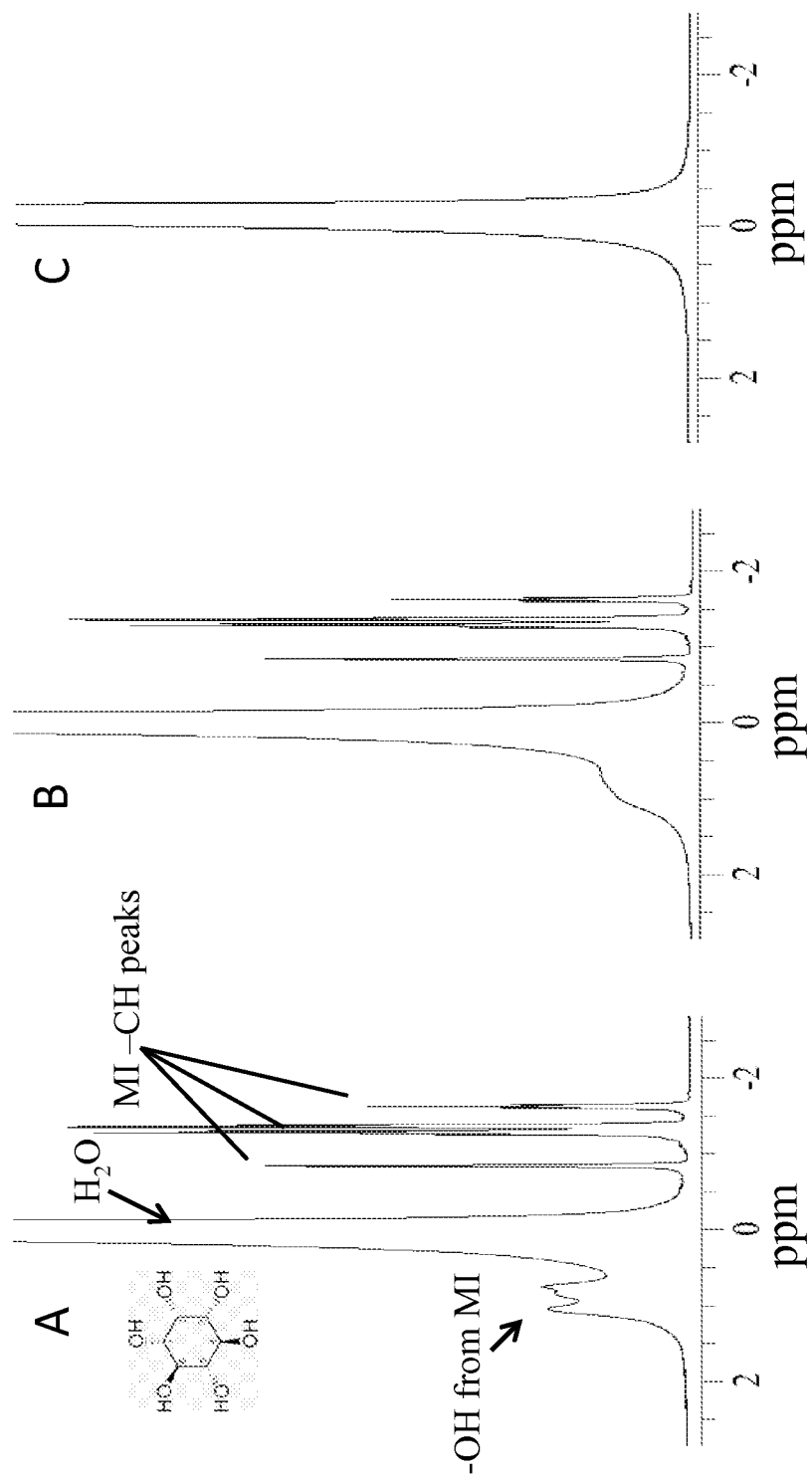
FIG. 18 illustrates the $^1H$ spectrum of 200 mM MI at pH 6.0, where

FIG. 18 illustrates high-resolution $^1H$ NMR spectra of MI (pH 6.0, 200 mM) and distilled water (pH 6.0), where FIG. 18A shows the three —OH peaks downfield to bulk water proton resonance and resonances from —CH groups up field from water, and the inset shows the chemical structure of MI. FIG. 18B illustrates the MI spectrum at pH 7.0 showing MI —CH resonances as well as broad —OH resonance, while FIG. 18C illustrates the spectrum from PBS alone. At a pH of 6.0 (FIG. 18A), the MI —OH peaks were narrower compared to that at pH 7.0 (FIG. 18B) due to slower exchange rate. The distilled water spectrum showed no peak other than water (FIG. 18C). Based on this initial finding, the three peaks present downfield to the bulk water were assigned to be from the MI-OH resonances.

Figure 19:
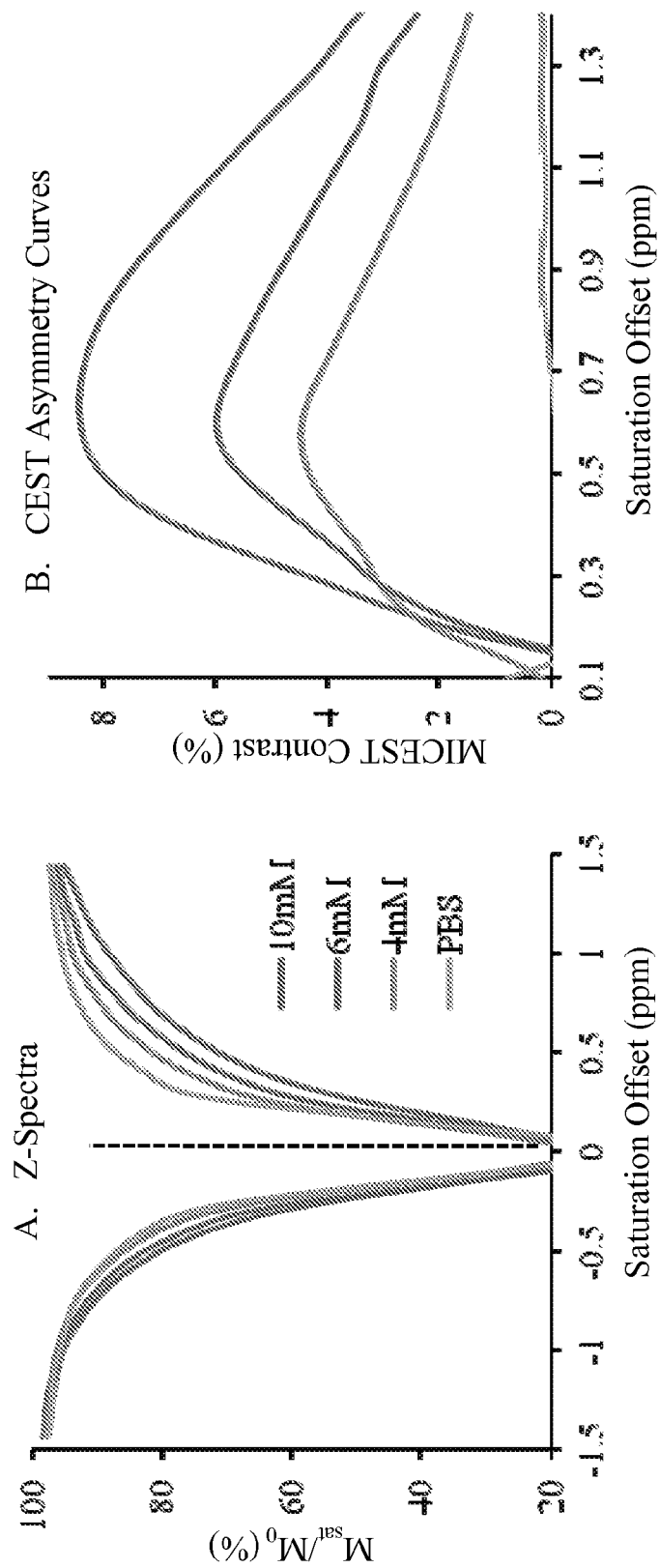
FIG. 19A illustrates the Z spectra of MI at different concentrations (pH7.4) showing asymmetry due to the CEST effect from exchangeable —OH protons of MI.
FIG. 19B illustrates CEST asymmetry curves showing the CEST effect centered ~0.6 ppm from the bulk water resonance.

FIG. 19 shows the Z-spectra of MI at different concentrations as well as PBS at a pH of 7.4. As illustrated in FIG. 19B, the MI Z-spectra shows a broad CEST peak centered at ~0.6 ppm downfield to the bulk water resonance, demonstrating that the —OH peaks of MI are the exchangeable groups responsible for creating a broad CEST effect spanning from ~0.2 ppm to 1.5 ppm. The PBS Z-spectra showed no CEST effect, while CEST asymmetry curves obtained from the Z-spectra clearly demonstrated the broader CEST effect centered at ~0.6 ppm (FIG. 19B). The T1 value measured from 10 mM MI solution at 9.4 T was 2.7 s. The exchange rate (k) was calculated to be around 600 s$^{-1}$ using Equation [3].

Figure 20:
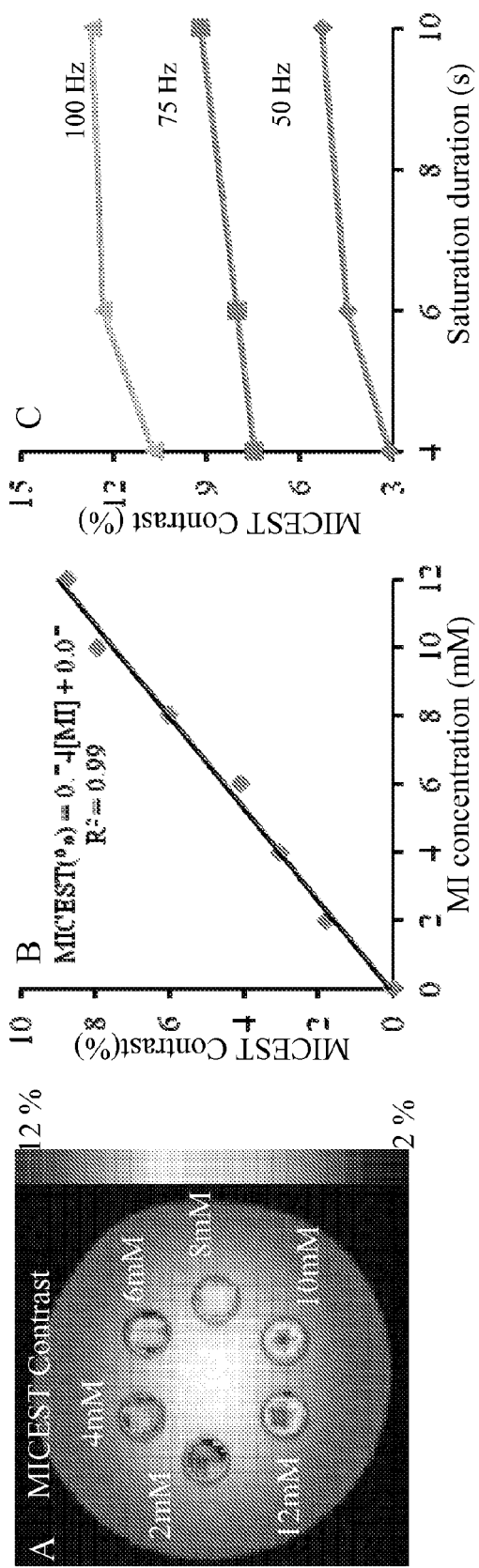
FIG. 20 illustrates MICEST imaging of MI phantoms containing different concentrations of MI (2, 4, 6, 8, 10 and 12 mM, pH 7.4) in PBS in using a 7T whole body scanner, where

FIG. 20 illustrates MICEST imaging of MI phantoms containing different concentrations of MI (2, 4, 6, 8, 10 and 12 mM, pH 7.4) in PBS in using a 7T whole body scanner. Images were collected with a Hanning windowed saturation pulse of 6 s duration and 75 Hz amplitude that was frequency selected at ±0.6 ppm. Subtraction of the two images shows CEST contrast only from MI. FIG. 20A shows the MI signal overlay on the CEST image obtained at −0.6 ppm, while FIG. 20B shows the linear dependence of MICEST effect on MI concentration with a slope of 0.74% per mM MI. As illustrated in FIG. 20A, the subtracted images showed signal only from the inner chambers containing MI. Due to symmetric saturation related to the bulk water resonance, no CEST contrast was observed from the outer chambers containing PBS. FIG. 20B shows MI CEST contrast as a function of MI concentrations, which demonstrates that the CEST effect increased with increasing MI concentration, indicating that the CEST effect of MI can serve as an index of its concentration. In FIG. 20C, the MICEST contrast from 10 mM MI solution at three different $B_1$ fields (50 Hz, 75 Hz and 100 Hz) and saturation pulse durations (4 s, 6 s and 10 s) are shown, thus depicting the changes in MICEST contrast with varying $B_1$ and saturation pulse duration. The color bar shows the MICEST contrast in percentage.

Figure 21:
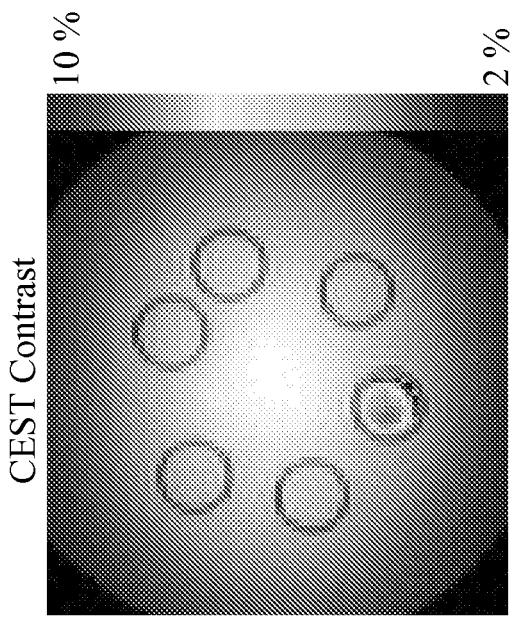
FIG. 21 shows the CEST effect from the major brain metabolites at their physiological concentrations, where at peak $B_1$ of 75 Hz and 6 seconds saturation pulse duration, only MI shows predominant CEST contrast with negligible contributions from other metabolites.

FIG. 21 illustrates a phantom consisting of test tubes with solution of different metabolites at their physiological concentrations [glucose (3 mM), glycogen (3 mM), Glu (10 mM), Creatine (10 mM), GABA (2 mM), and MI (10 mM), pH=7.4] immersed in a beaker containing PBS. FIG. 21 thus shows the CEST effect from the major brain metabolites at their physiological concentrations. At peak $B_1$ of 75 Hz and 6 seconds saturation pulse duration, only MI shows predominant CEST contrast with negligible contributions from other metabolites.

Figure 22:
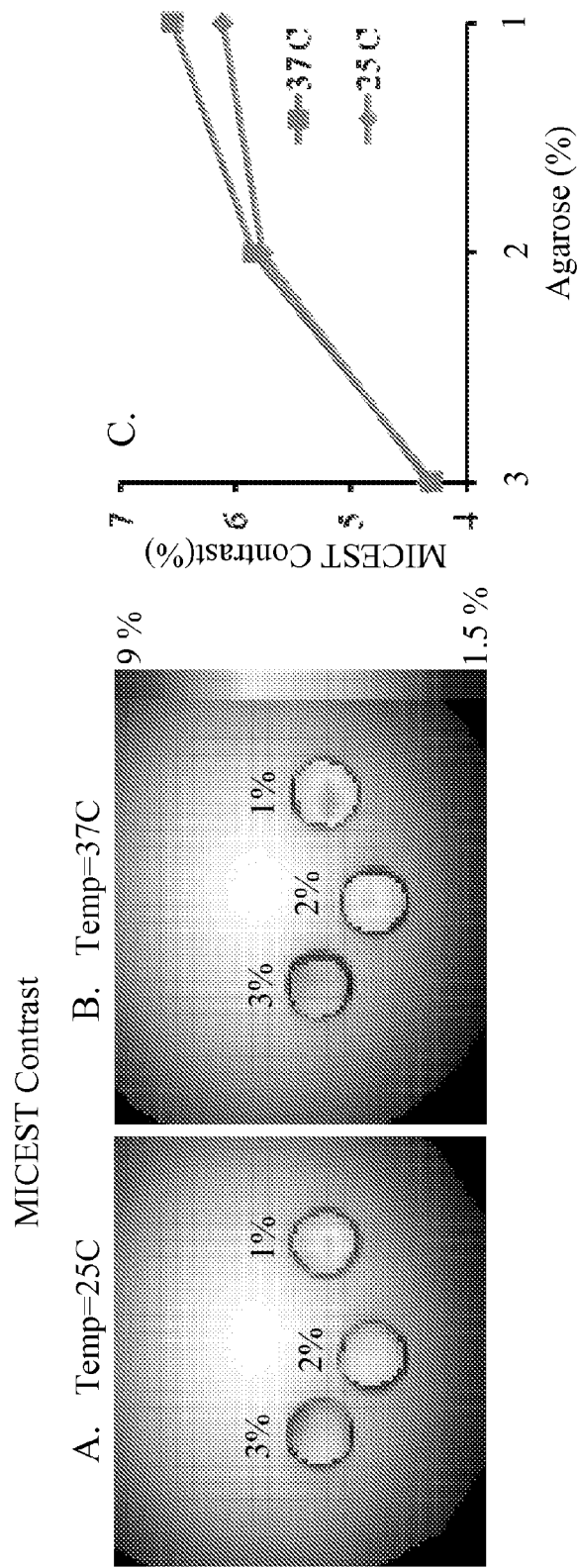
FIGS. 22A-22C illustrate MICEST maps of phantom consisting of test tubes with the same concentration of MI (10 mM) in different viscous media (1%, 2% and 3% agarose).
Figure 23:
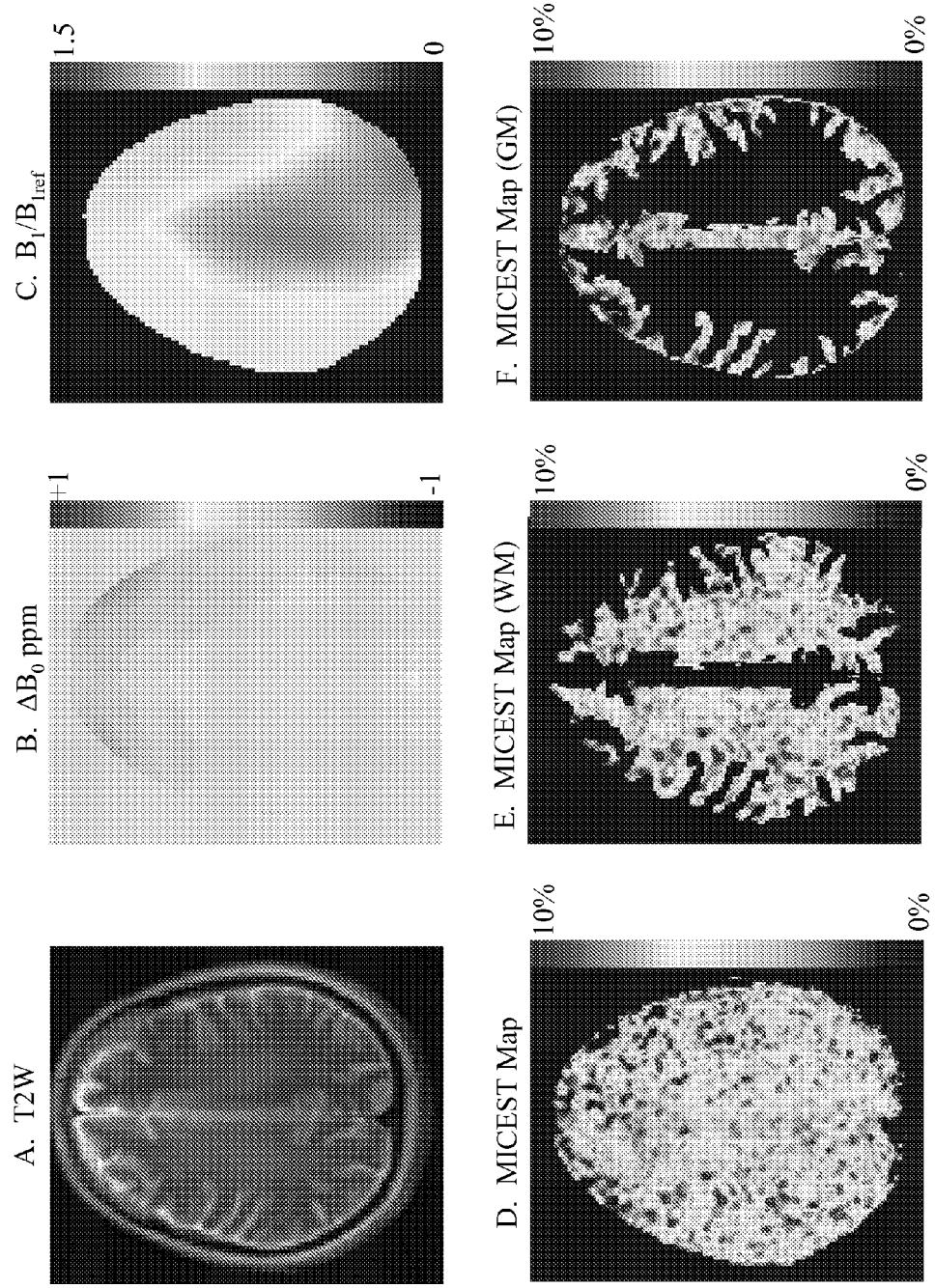
FIG. 23 illustrates axial images of a healthy human brain, where

FIG. 22 illustrates MICEST maps of phantom consisting of test tubes with the same concentration of MI (10 mM) in different viscous media (1%, 2% and 3% agarose). The highest MICEST contrast was observed in 1% agarose medium followed by 2% and 3% at both 25° C. and 37° C. (FIGS. 22A and 22B). FIG. 22C shows the higher MICEST contrast in 1% agarose at 37° C. compared to 25° C. It can also be observed that the MICEST contrast was higher in the medium with the 1% followed by the 2% and 3% agarose.

To evaluate whether MI detection is feasible in the brain, a MICEST experiment was performed on the human brain on a 7T clinical scanner. After application of saturation pulses at ±0.6 ppm, a relative difference in the water signal was observed similar to the phantom shown in FIG. 20. To correct for the $B_0$ and $B_1$ variations in the brain image, $B_0$ and $B_1$ maps were obtained on the same imaging slice shown in FIGS. 23B and 23C. After shimming of the main magnetic field, a fairly uniform $B_0$ field (<0.3 ppm) was achieved across the brain image. Similarly, the $B_1$ map shows small variation across most area of the brain (<30% of reference $B_1$ or $B_{1ref}$). MICEST map from an axial slice of human brain is shown in FIG. 23D. MICEST maps from segmented white and gray matter of the same axial brain slice are shown in FIGS. 23E and 23F. Overall, white matter regions exhibited significantly higher (p=0.03) MICEST than the gray matter regions.

Figure 24:
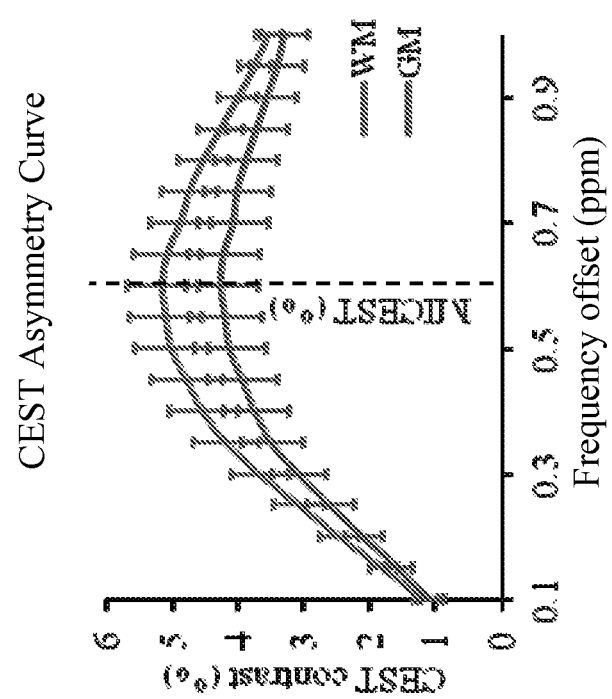
FIG. 24 illustrates the CEST asymmetric curves from the segmented white matter (WM) and gray matter (GM) regions of the brain.

FIG. 24 illustrates the CEST asymmetric curves from the segmented white matter (WM) and gray matter (GM) regions of the brain. These curves show the maximum CEST contrast at around 0.6 ppm. Table 1 below shows average MICEST values and coefficient of variation (CV) from white and gray matter regions of healthy volunteers.

TABLE 1

| Subject | MICEST (Mean) | | CV | |
| --- | --- | --- | --- | --- |
| | WM | GM | WM | GM |
| 1 | 4.93 | 4.06 | 0.49 | 0.52 |
| 2 | 5.47 | 4.95 | 0.51 | 0.69 |
| 3 | 5.71 | 4.48 | 0.49 | 0.60 |
| 4 | 4.33 | 3.47 | 0.55 | 0.60 |
| 5 | 5.34 | 4.29 | 0.43 | 0.48 |

As noted above, the high-resolution NMR spectra showed three MI-OH peaks downfield to the bulk water resonance at pH 6.0, which broadened at pH 7.0. This may be due to the pH dependent change in the exchange rate, which is known to be decreased at low pH. Z-spectra acquired with MI solutions at varying concentrations showed a broad CEST effect (0.1 ppm to 1.2 ppm) centered at ~0.6 ppm and indicate that the peaks present downfield to the bulk water are due to exchangeable groups on MI. At physiological pH 7.4 the exchange rate (k) was determined to be ~600 s$^{-1}$. Compared to the chemical shift difference both at 9.4T ($\Delta\omega$=1.6×10$^3$ rad/s) and 7T ($\Delta\omega$=1.2×10$^3$ rad/s) the exchange rate of MI —OH proton is in slow to intermediate exchange rate and satisfies the condition ($\Delta\omega$>k).

For measurement of k based on Equation [3], sufficient B$_1$ and pulse duration are prerequisites for complete saturation. In the current study, this condition was met at 200 Hz with 6 s duration.

In comparing the potential sensitivity advantage of CEST in detecting MI compared to traditional MRS measurement based on aliphatic protons (—CH), one may assume that average brain MI concentration is 8 mM and the proton signal from a single —CH group is detected as 8 mM. On the other hand, from FIG. 20, 8 mM MI leads to a ~6% CEST effect from the six —OH protons. This implies that ~6.6M decrease in water proton concentration from 110M. In essence, the CEST provides a >200 fold amplification of MI under physiological conditions.

Also, the presence of six exchangeable —OH protons in MI makes it a more appropriate endogenous CEST agent. A CEST effect has been previously reported from —OH protons on Glc and Gly. While the Z-spectra from glucose showed three CEST peaks between 1-2 ppm downfield to the bulk water, glycogen Z-spectra showed a CEST peak at 1 ppm downfield to bulk water. The reasonable chemical shift difference (0.3-1.3 ppm) between the MI-OH and Glc —OH protons minimizes the probability of overlap of CEST effects between these two metabolites. The normal Glc and Gly concentration in brain is ~2-4.0 mM, and it has been shown that at physiological pH, CEST effect at these concentrations is negligible (van Zijl et al., "MRI detection of glycogen in vivo by using chemical exchange saturation transfer imaging (glycoCEST)," Proc. Natl. Acad. Sci. USA, Vol. 104, pp. 4359-4364 (2007)).

Other major metabolites in the brain with significant concentrations are: N-acetyl aspartate (NAA), choline (Cho), Cr, Glu, GABA and glutamine (Gln). Of these metabolites, Cho does not have any exchangeable protons to provide CEST. Amide proton on NAA is expected to resonate beyond 3.0 ppm and at the physiological pH no CEST effect was observed from it. At the physiological pH, amine protons from Gln do not exhibit appreciable CEST effect. Cr, GABA and Glu with their —NH2 protons exhibit CEST effect at 2.0 ppm, 2.75 ppm and 3 ppm, respectively. The Cr and Glu concentration in the brain is around 10 mM while the concentration of GABA is around 2 mM. To evaluate any CEST effect from these metabolites at 0.6 ppm due to the exchange broadening, a solution of these metabolites was made in their respective concentration (i.e. Cr (10 mM), Glu (10 mM) and GABA (2 mM), Glc (3 mM), Gly (3 mM) along with MI (10 mM)) and immersed in a large beaker containing PBS. At 75 Hz B$_1$ and 6 s duration of saturation pulse, a predominant CEST effect was observed from MI and negligible contribution from other metabolites. However, increasing the B$_1$ (>75 Hz) not only increases the MICEST contrast but also leads to measurable CEST effect from other metabolites, demonstrating that the choice of 75 Hz B$_1$ and ~6 s long saturation pulse leads to minimal contamination from other metabolites to MICEST contrast.

It is possible that the observed MICEST effect in the human brain may be affected by MI concentration, viscosity, as well as temperature. As is well known, temperature and viscosity changes are reflected in the exchange rate. Although agarose is used to change the viscosity, it does not mimic the true physiological condition. Under physiological conditions, the temperature is constant and viscosity varies between white matter, gray matter and CSF. In general, white matter has higher viscosity as compared to the gray matter and CSF. Given that higher viscosity leads to lower CEST (based on the results from agarose phantoms), if the viscosity is the factor that is contributing to the MICEST, then the observed MICEST in the white matter should be lower than that of the gray matter; which is not the case. Hence, the difference in MICEST in vivo may be predominantly due to difference in MI concentration and contributions from viscosity and from other variables, if any, may be minor. These observations are supported by some of the previous MRS studies that have shown higher MI concentration in white matter than in gray matter regions. The CEST asymmetry curves from the gray and white matter showed a broad peak centered at ~0.6 ppm (FIG. 23F).

A statistically significant difference (p=0.03) of MICEST from white and gray matter has been observed in this embodiment of the invention. The average MICEST from white matter (n=5) is 5.2±0.5% and from gray matter is ~4.3±0.5%, which are consistent with the reported difference between MRS derived white and gray matter MI levels This is also supported by immunohisto-pathological studies that have shown significantly higher glial cells density in white matter than in gray matter. In the human brain, ~20-30% higher microglial cells were observed in white matter compared to gray matter; however, an extensive human study is required to draw firm conclusions on the gray and white matter variations of MICEST.

Since the CEST effect is highly dependent on local B$_0$ and B$_1$ homogeneity, in this study, B$_0$ and B$_1$ maps were used to effectively correct MICEST maps. It is worthwhile discussing the effects of suboptimal B$_0$ correction to MICEST. B$_0$ inhomogeneity potentially leads to the shift in CEST asymmetry curve and also affects the magnitude of MICEST observed at ~0.6 ppm. Similarly B$_1$ inhomogeneity causes inaccurate MICEST values which can be corrected with a linear model for the B$_1$ variations reported above. Overall, a robust B$_0$ and B$_1$ correction is necessary to quantify MICEST.

In this embodiment of the invention, the inventors were able to detect an average 5% MICEST from human brain, which will enable the detection of changes in the MI concentration due to pathological changes. Those skilled in the art will further appreciate that the higher spatial resolution of CEST imaging will provide improved diagnosis and prognosis efficacy in all the pathologies with altered MI. In the examples above, the inventors used very small B$_1$ (75 Hz) and 6 s pulse duration for MICEST imaging saturation pulse power, duration, and pulse shapes. Those skilled in the art will appreciate that these values may be optimized to improve the observed CEST effect. Those skilled in the art will further appreciate that the results disclosed herein could be used for relative measurement of changes in brain MI levels and that high resolution mapping of MI would be a useful technique for monitoring different disease states, their progression, and efficacy of treatment. Thus, in accordance with the present embodiment, MI may provide a new disease biomarker for monitoring disease states in the brain.

Also, as noted above, pH changes in the brain may be measured to distinguish a region of hypoxia and stroke that is partially ischemic from healthy brain tissue.

Detection of Molecular Changes in Alzheimer Disease Using MICEST

Myo-inositol (MI) is a marker of glial cells proliferation and has been shown to increase in early Alzheimer's disease (AD) pathology. As noted above, MI exhibits a concentration dependent chemical-exchange-saturation-transfer (CEST) effect (MICEST) between its hydroxyl groups and bulk water protons, and using the endogenous MICEST technique, brain MI concentration and glial cells proliferation can be mapped at high spatial resolution. In this embodiment, the high resolution mapping of MI was performed using the MICEST technique on ~20 months old APP-PS1 transgenic mouse model of Alzheimer's Disease (AD) as well as on age matched wild type (WT) control (n=5). As will be explained below, the APP-PS1 mice show (~50%) higher mean MICEST contrast than the WT control with concomitant increase in MI concentration as measured through proton spectroscopy. Immunostaining against glial-fibric-acidic protein also depicts proliferative glial cells in larger extent in APP-PS1 than WT mice, which correspond to the higher MI concentration. Use of MICEST in early detection of AD pathology is made possible in this embodiment, as will be explained further below.

Alzheimer's disease (AD) is the most common cause of dementia in elderly, affecting approximately 2-4 million individuals in the United States and more than 30 million worldwide. The pathological hallmarks of AD include extracellular deposition of amyloid beta (Aβ), neurofibrillary tangles, neuronal and synaptic loss, and AD is further characterized by reactive gliosis and inflammation. The neurodegeneration in AD is associated with the activation of glial cells in brain parenchyma, and the most common glial cell type activated in AD is astrocytes. Although the nature of the trigger that causes activation of astrocytes in AD brain in vivo is not clear, in vitro studies have shown that both aggregated Aβ protein and the intact cores of amyloid plaques isolated from human AD brain tissue can stimulate activation of astrocytes. Once activated, these cells secrete cytokines and chemokines that, in turn, damage the neuronal cells. Currently, the elevated expression of activated glial cells in AD brain pathology is evaluated through immuno-staining against glial fibric acidic protein (GFAP). This method is invasive and requires extensive in vitro tissue processing with antibodies treatment and does not allow for longitudinal studies of measuring glial cell proliferation in vivo.

Positron Emission Tomography (PET) exploits radioactive ligands that bind to the receptors of the glial cells. The radioactive ligand used to study the glial cells proliferation in AD is PK11195 (1-[2-chlorophenyl]-N-methyl-N-[1-methylpropyl]-3-isoquinoline carboxamide), which has shown increased regional binding for the benzodiazepine receptor in AD compared to control. The major shortcomings of PET are radiation exposure, low resolution, and imaging logistics due to short half-lives of radio ligands. While magnetic resonance imaging (MRI) is noninvasive and provides high resolution and exquisite structural details, existing MRI methods are not capable of imaging the distribution of glial cells in the brain. Proton magnetic resonance spectroscopy ($^1$HMRS) provides a non-invasive way to monitor the biochemical changes in the brain during disease progression and has been widely used to detect the changes in various metabolites in AD both in the transgenic animal model as well as the human brain. Each metabolite provides unique information about the disease pathology as they are sensitive to pathological changes at the cellular or molecular level. For example, —N-acetyl aspartate (NAA), a marker of neuronal density and glutamate excitatory neurotransmitters, has been shown to decrease in AD pathology. On the other hand, myo-inositol (MI), which is a marker of glial cells proliferation, has been shown to increase in AD pathology. $^1$HMRS studies have shown progressively increased MI concentration with advancing age in the APP-PS1 transgenic AD mouse brain compared to the wild type (WT) control. Although, $^1$HMRS has been widely used to monitor MI changes in AD, it suffers from poor resolution and also does not provide the map of the brain region with active glial cells proliferation/activation at high resolution. As it already has been reported that a brain region with increased concentration of MI is associated with the glial cells proliferation/activation, the high resolution mapping of MI may serve as the surrogate map of the glial cells distribution in the brain. Thus, because of the potential role of glial cells in AD, and limitations of exiting techniques, there is a clear and immediate need for a non-invasive, high resolution imaging technique to monitor their changes in vivo.

As noted in the embodiment described above, high-resolution mapping of MI in the human brain has been introduced by exploiting exchangeable —OH protons present on MI using MICEST imaging. Due to the inherent nature of the CEST method, the MICEST technique offers about two orders of magnitude higher sensitivity compared to $^1$HMRS. In CEST, the exchangeable protons of a solute molecule can be selectively irradiated by application of the radio-frequency (RF) pulse and their saturated magnetization transfer with bulk water leads to decrease in bulk water signal in a solute concentration dependent manner. The CEST technique has been earlier used to map the pH as well as protein changes in the brain by exploiting the amide proton (—NH). The exchangeable —OH proton also has been used to monitor the glycogen change in the liver and proteoglycan in the knee cartilage.

As will now be explained, the inventors have demonstrated high resolution mapping of MI using the MICEST technique in transgenic APP-PS1 AD mice and have shown elevated MICEST contrast compared to WT mice. The increase in MICEST also has been compared to changes in MI signal amplitude on $^1$HMRS as well as GFAP immunohistochemistry results in both AD and WT mice. The potential implication of MICEST imaging in detecting early AD pathology is also discussed in detail below.

Five APP-PS1 mice and 5 WT mice with ages spanning from 18 to 20 months were used in an animal study. The mice were transferred to a 9.4T horizontal bore small animal MR scanner (Varian, Palo Alto, Calif.) and placed in a 20-mm diameter commercial quadrature proton coil (m2m Imaging Corp., Cleveland, Ohio). The animals were kept under anesthesia (1.5% isoflurane in 1 liters/min oxygen) and their body temperature was maintained with the air generated and blowing through a heater (SA Instruments, Inc., Stony Brook, N.Y.). Respiration and body temperature were continuously monitored using a MRI compatible small animal monitor system (SA Instruments, Inc., Stony Brook, N.Y.).

CEST imaging of the mouse brain was performed using a custom-programmed segmented RF spoiled gradient echo (GRE) readout pulse sequence with a frequency selective continuous wave saturation preparation pulse. The sequence parameters were: field of view=20×20 mm$^2$, slice thickness=2 mm, flip angle=15°, GRE readout TR=6.2 ms (64 segments), TE=2.9 ms, matrix size=128×128, number of averages=1. For every 8 s, one saturation pulse and 64 acquisition segments were applied. CEST images were collected using a 5 second saturation pulse at peak $B_1$ of 75 Hz with varying frequencies from 0-1.5 ppm in step size of 0.1 ppm. $B_1$ and $B_0$ maps were also acquired and used to correct the MICEST contrast as described above. The total imaging time including $B_0$ and $B_1$ mapping was around 20 minutes. MICEST contrast was calculated at ±0.6 ppm by normalizing with 20 ppm signal using Equation [6]:

$$MICEST = 100 * \left(\frac{S_{-ve} - S_{+ve}}{S_0}\right) \quad [6]$$

where $S_{-ve}$, $S_{+ve}$ and $S_0$ are the $B_0$ corrected MR signals at −0.6 ppm, +0.6 ppm and 20 ppm, respectively. The CEST asymmetry curves were also generated by plotting the relative water signal difference at frequency offsets from 0 to 1.2 ppm.

Single voxel spectra (SVS) were performed with stimulated echo acquisition mode (STEAM) using a vendor (Varian) provided pulse sequence with the following parameters: voxel size=4 mm×4 mm×2 mm (Voxel volume 32 μL), spectral width=4 kHz, number of points=4006, averages=264, TE=8 ms, Tm=7 ms, and TR=5 s. Water suppression was achieved using the variable pulse power and optimized relaxation delays method (VAPOR). Localized shimming was performed to obtain localized water line width values of 0.075 ppm or less. Unsuppressed water spectrum was also acquired using the same parameter for the purpose of normalization. SVS spectra were obtained from the raw free induction decay data by exponential apodization (20 Hz), Fourier transformation, phase correction and baseline removal. Peak integrals of MI peak and unsuppressed water peak were calculated using a non-linear least squares fitting (MATLAB "nlinfit" routine) program. Peak integrals were calculated and normalized with non-water suppressed proton signal for calculating MI concentrations in-vivo.

All image processing and data analysis were performed using software routines written in MATLAB (version 7.5, R2007b). Acquired images were $B_0$ and $B_1$ corrected and CEST contrast was calculated from Equation [6]. MICEST contrast was mapped as false-colors onto an anatomical proton image.

All of the excised mice brains were fixed in 10% buffered formalin and embedded in paraffin. The whole specimen was blocked and 6 μm sections were taken for the immunohistochemistry analysis. The slides were deparaffinized in Xylene (Surgipath, 03672) followed by rehydration with 100%, 95%, 70% ethanol. Antigen retrieval was performed in the digital decloaking chamber (Biocare medical, DC2002) by using citric acid based antigen unmasking solution (Vector laboratories, H-3300). The sections were blocked with 4% BSA (Sigma, A-7906) and 2% goat or horse serum in a TT buffer (10 mM of Tric-HCI, 500 mM NaCI, and 0.05% Tween-20) at room temperature for 30 minutes. Sections were then incubated with primary antibody diluted in blocking buffer at 4° C. overnight. The primary antibody concentration for GFAP was 1:20. Following washing in a Tris buffer, a secondary antibody diluted at 1:200 (Vector laboratories, BA-1000 or BA-9200) in a blocking buffer was added and incubated at room temperature for 45 minutes. After three washes, the sections were incubated with Vectastain ABC reagent (Vector laboratories, PK-6100) for 40 minutes at room temperature. The sections were again washed thrice in Tris buffer and incubated with the chromogen diaminobenzidine-tetrahydrochloride (DAB) ((Sigma, D4293) substrate followed by counterstaining in hematoxylin. The sections were mounted in DPX mountant. Parallel control slides were run with all batches including positive and negative controls. For evaluation of GFAP immunostain cells, each GFAP immunostained slide was digitized with a 1.25× and 20× objective using an Olympus camera.

Figure 25:
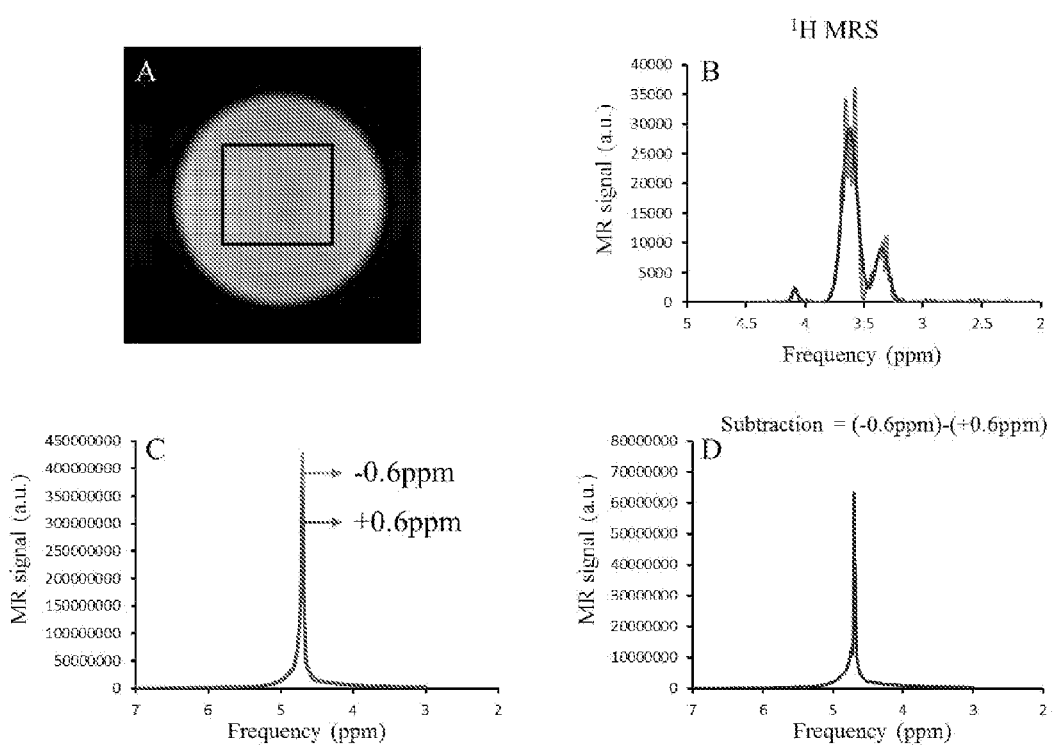
FIG. 25 illustrates an image (FIG. 25A) showing the single voxel localization from a bottle of 10 mM MI (pH=7.0, 37 C) prepared in phosphate buffer saline, the $^1H$ MRS PRESS water suppressed spectrum (TR=20 s, TE=16 ms, 4 averages) (FIG. 25B) from the single voxel shown in the image of FIG. 25A, the water $^1H$ resonance spectra (FIG. 25C) obtained while saturating at ±0.6 ppm as well as their difference spectrum, and the difference spectrum of water resonance obtained from the absolute difference of two spectra obtained while saturating at ±0.6 ppm (FIG. 25D).

The results of the MICEST imaging are illustrated in FIGS. 25-30. FIG. 25 shows the single voxel localization from a bottle of 10 mM MI (pH=7.0, 37 C) prepared in phosphate buffer saline. FIG. 25B illustrates the $^1$H MRS PRESS water suppressed spectrum (TR=20 s, TE=16 ms, 4 averages) from the single voxel shown in the image of FIG. 25A. The MI peak at ~3.56 ppm is used in quantifying MI from the brain. The measured integration of MI peak at ~3.56 ppm is 90.16 units. FIG. 25C illustrates the water $^1$H resonance spectra obtained while saturating at ±0.6 ppm as well as their difference spectrum. FIG. 25D illustrates the difference spectrum of water resonance obtained from the absolute difference of two spectra obtained while saturating at ±0.6 ppm using as saturation parameters a pulse train consisting of 50 Hanning windowed rectangular pulses with peak $B_1$ of 75 Hz and duration 100 ms each for a total duration of 5 s. The difference spectrum represents the +0.6 ppm point on the CEST asymmetry spectrum and its integration value is 106546.6 units. FIG. 25 further illustrates the sensitivity advantage of MICEST at physiological concentration and temperature and shows over two orders of magnitude higher sensitivity for MICEST over $^1$H MRS of MI.

Figure 26:
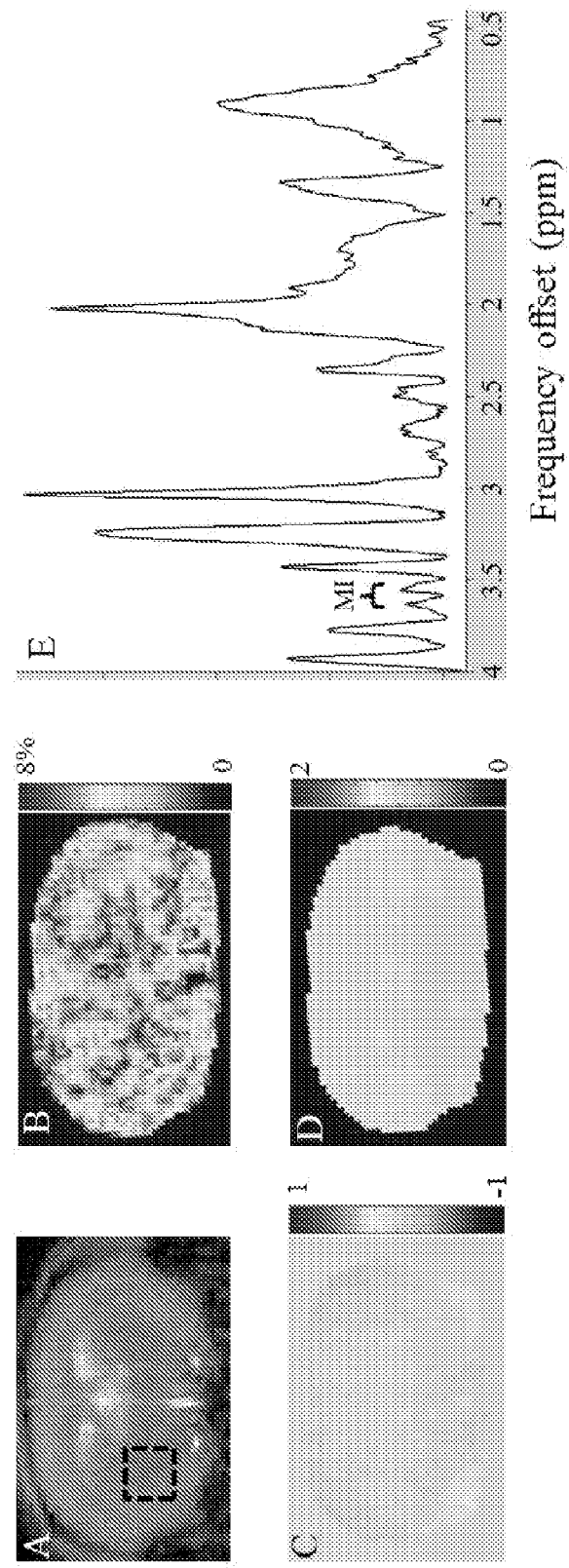
FIG. 26 illustrates an anatomical image from a 20 months old WT mouse (FIG. 26A), a MICEST map for the corresponding slice showing the distribution of MI in the brain of the WT mouse (FIG. 26B), the correction of the MICEST map for any $B_0$ and $B_1$ fields inhomogeneity (FIGS. 26C and 26D), and the $^1HMRS$ spectrum for the voxel as shown in FIG. 26A, demonstrating all the metabolites present in the mouse brain (FIG. 26E).
Figure 27:
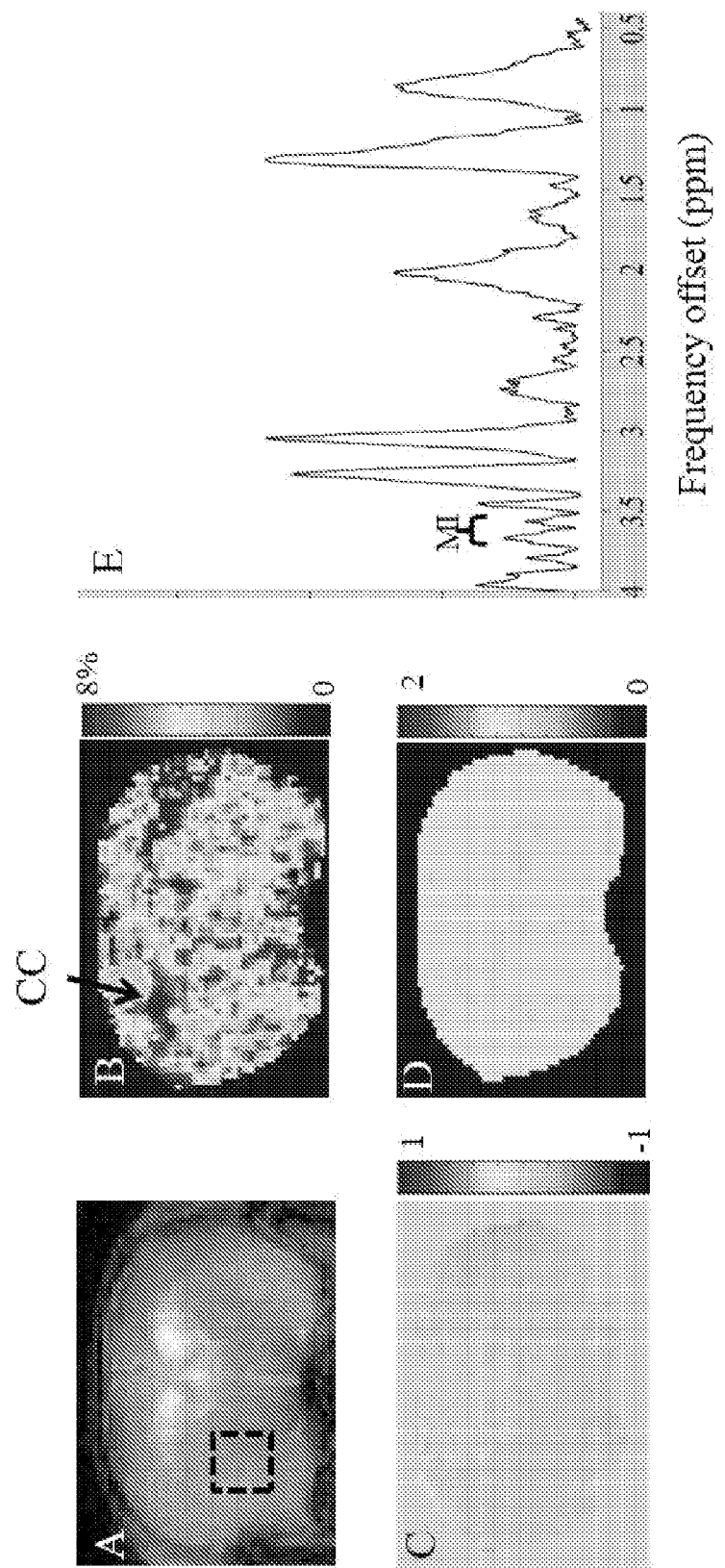
FIG. 27 illustrates an anatomical image from a 20 months old APP-PS1 transgenic mouse model of Alzheimer's Disease (FIG. 27A), the MICEST maps for the corresponding slice showing the distribution of MI in the brain of the APP-PS1 transgenic mouse model (FIG. 27B), The correction of the MICEST map for any $B_0$ and $B_1$ fields inhomogeneity (FIGS. 27C and 27D), and the $^1HMRS$ spectrum for the voxel as shown in FIG. 27A, demonstrating all the metabolites present in the mouse brain (FIG. 27E).

The brain anatomical images, static magnetic field ($B_0$), radiofrequency field ($B_1$) maps, MICEST maps and MRS spectra from WT and APP-PS1 mice are shown in FIGS. 26 and 27.

FIG. 27A illustrates an anatomical image from a 20 months old WT mouse, while FIG. 27B illustrates a MICEST map for the corresponding slice showing the distribution of MI in the brain. The MICEST map was obtained at peak $B_1$ of 75 Hz with 5 s saturation pulse duration. The MICEST map of FIG. 27B was also corrected for any $B_0$ and $B_1$ fields inhomogeneity (FIGS. 27C and 27D). $B_0$ and $B_{1ref}$ maps show the field inhomogeneity on the brain. The $B_0$ map shows less than 0.2 ppm variation on the brain, while the $B_1$ map is quite homogenous. FIG. 27E illustrates the $^1$HMRS spectrum for the voxel as shown in FIG. 27A, demonstrating all the metabolites present in the mouse brain. The MI peaks are shown by an arrow.

FIG. 28A illustrates an anatomical image from a 20 months old APP-PS1 transgenic mouse model of AD. FIG. 28B illustrates MICEST maps for the corresponding slice showing the distribution of MI in the brain. Higher MICEST contrast is depicted in the brain compared to the WT mouse. The corpus collosum (arrow), white matter regions, shows much higher MICEST contrast than other brain regions. The MICEST map was obtained at a peak $B_1$ of 75 Hz with 5 s saturation pulse duration. The MICEST map of FIG. 28B was also corrected for any $B_0$ and $B_1$ fields inhomogeneity (FIGS. 28C and 28D). The $B_0$ and $B_{1ref}$ maps show the field inhomogeneity on the brain. The $B_0$ map show less than 0.2 ppm variation on the brain, while the $B_1$ map is quite homogenous. FIG. 28E illustrates the $^1$HMRS spectrum for the voxel as shown in FIG. 28A, demonstrating all the metabolites present in the mouse brain. The MI peaks are shown by arrow, which clearly show an increase signal amplitude compared to the WT mouse. Except for MI, all other metabolites (i.e., N-acetyl aspartate, glutamate, creatine, taurine) are decreased compared to the WT mouse, which is characteristic of AD pathology.

Figure 28:
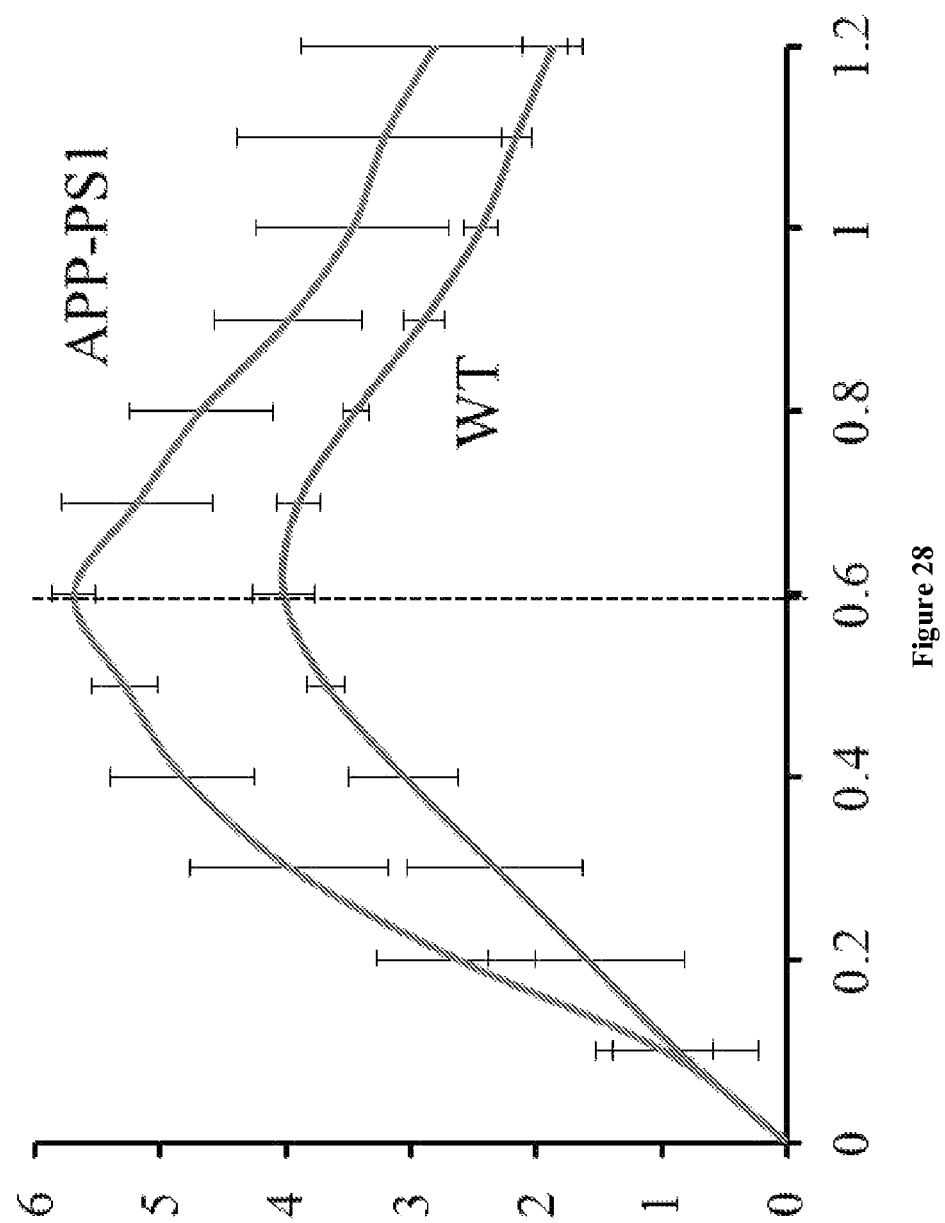
FIG. 28 illustrates the Z-spectra asymmetry curve for the voxels shown in FIGS. 25A and 26B are quite broad and show the maximum CEST contrast at 0.6 ppm.

In the images of FIGS. 27 and 28, shimming of the main magnetic field provided a fairly uniform $B_0$ field (heterogeneity <0.2 ppm) across the brain image while the $B_1$ map was quite homogeneous. The mean MICEST contrast obtained by application of 75 Hz $B_1$ and 5 s saturation pulse duration from the APP-PS1 and WT mice brain over the chosen voxel is shown in Table 2. In the APP-PS1 mice brain, the MICEST contrast was significantly higher (p<0.05) than for the WT mice brain. Table 2 shows the MICEST contrast and absolute MI concentration in WT and APP-PS1 mice for the voxels shown in FIG. 25A and FIG. 26B. Both MICEST and [MI] are significantly higher in APP-PS1 than WT mice. Comparative analysis showed ~50% higher MICEST (p<0.05) contrast in APP-PS1 mice brain than in that of WT mice. Predictably, the corpus collosum (CC), a white matter region known to have higher glial cell density, showed higher MICEST contrast compared to cortex regions (shown by arrow in FIG. 27B).

TABLE 2

| Number | WT | | APP-PS1 | |
|---|---|---|---|---|
| | MICEST (%) | MI (mM) | MICEST (%) | MI (mM) |
| 1 | 3.73 | 4.47 | 5.48 | 6.43 |
| 2 | 4.03 | 4.83 | 5.74 | 6.86 |
| 3 | 3.64 | 4.17 | 5.62 | 6.58 |
| 4 | 4.19 | 4.92 | 6.23 | 7.14 |
| 5 | 3.71 | 4.28 | 5.82 | 6.89 |
| Mean ± SD | 3.86 ± 0.24 | 4.53 ± 0.33 | 5.78 ± 0.28 | 6.78 ± 0.28 |

MRS spectra obtained for the voxel shown on the anatomical images of FIGS. 26A and 27A are shown in FIGS. 26E and 27E. This voxel was placed in an area devoid of cerebral spinal fluid. The MI peak integral was normalized with an unsuppressed water peak integral. $^1$HMRS spectra for the voxels as shown in the anatomical images in both FIGS. 26 and 27 clearly show elevated an MI peak signal in APP-PS1 compared to WT mice. Both spectra are displayed on the same vertical scale. Decreased peak signal amplitude from other metabolites (i.e., glutamate, NAA, creatine, choline, and taurine) can also be seen from the $^1$HMRS spectra. The [MI] was significantly higher in APP-PS1 mice compared to WT. A shown in Table 2, the measured [MI] for APP-PS1 and WT mice exhibit an average of 49% increase in [MI] in APP-PS1 compared to WT mice.

The CEST asymmetry curve typically reflects the relative water signal change at different frequency offset due to the exchange between saturated labile protons with water protons. In the case of MI, the labile —OH protons have been shown to resonate at ~0.6 ppm and depict the maximum MICEST contrast at ~0.6 ppm. FIG. 28 shows the Z-spectra mean CEST asymmetry curve from the chosen voxel obtained at peak $B_1$ of 75 Hz and 5 second saturation duration from APP-PS1 (n=5) and WT mice (n=5). The 0.6 ppm line on the CEST asymmetry curves corresponds to MICEST contrast. These curves are rather broad and show a maximum CEST contrast at around 0.6 ppm. The CEST asymmetry curves clearly depict the higher MICEST contrast in APP-PS1 mice brain compared to WT mice.

Figure 29:
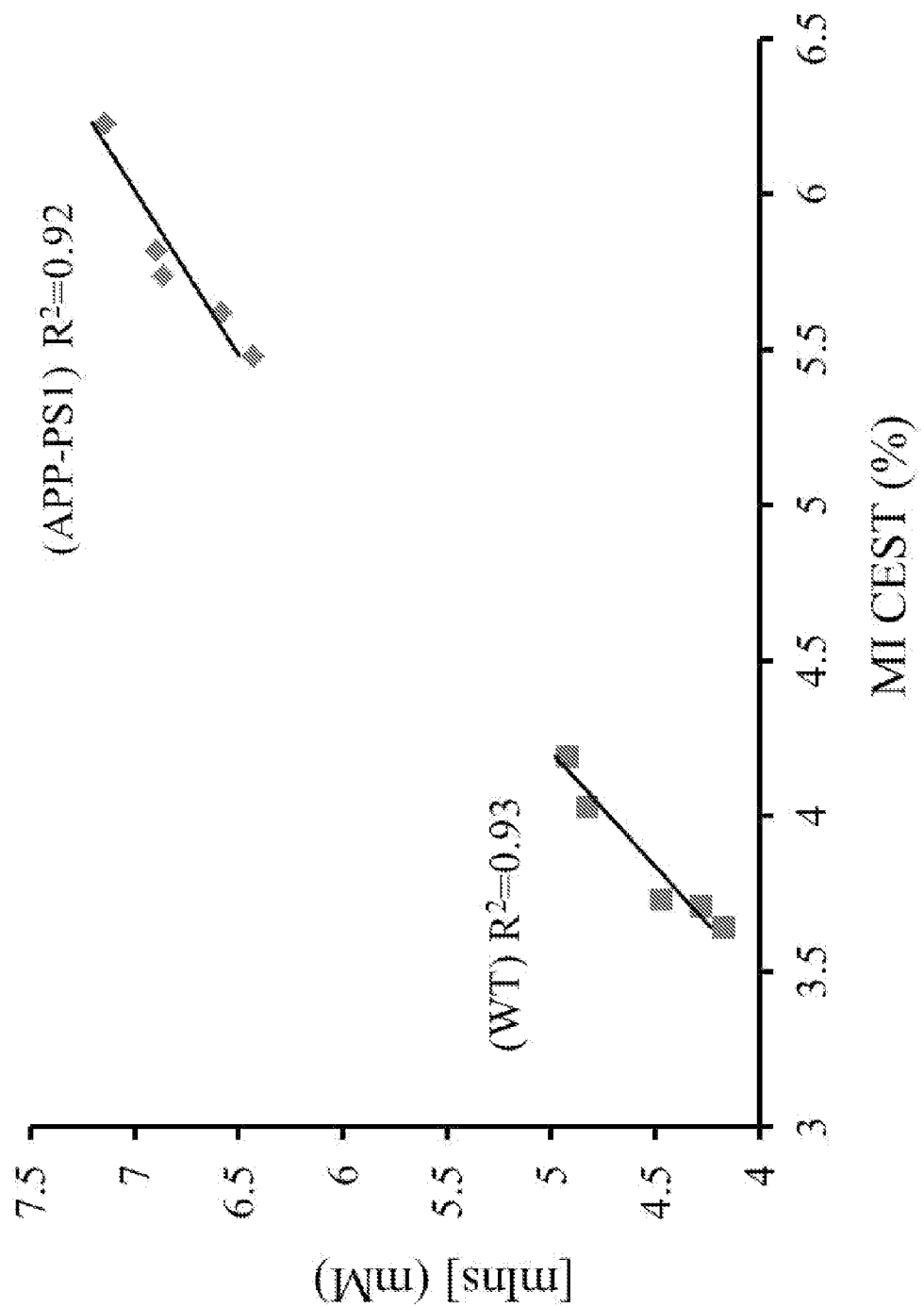
FIG. 29 illustrates a graph plot showing the relation between MICEST contrast and measured MI concentration on $^1HMRS$.

FIG. 29 illustrates a graph plot showing the relation between MICEST contrast and measured MI concentration on $^1$HMRS. The graph plots shown in FIG. 29 represent the correlation between MI concentration measured through $^1$HMRS and MICEST in APP-PS1 and WT mice. A good positive correlation ($R^2$>0.8) was observed between MICEST and measured MI concentration through $^1$HMRS both in APP-PS1 and WT mice.

Figure 30:
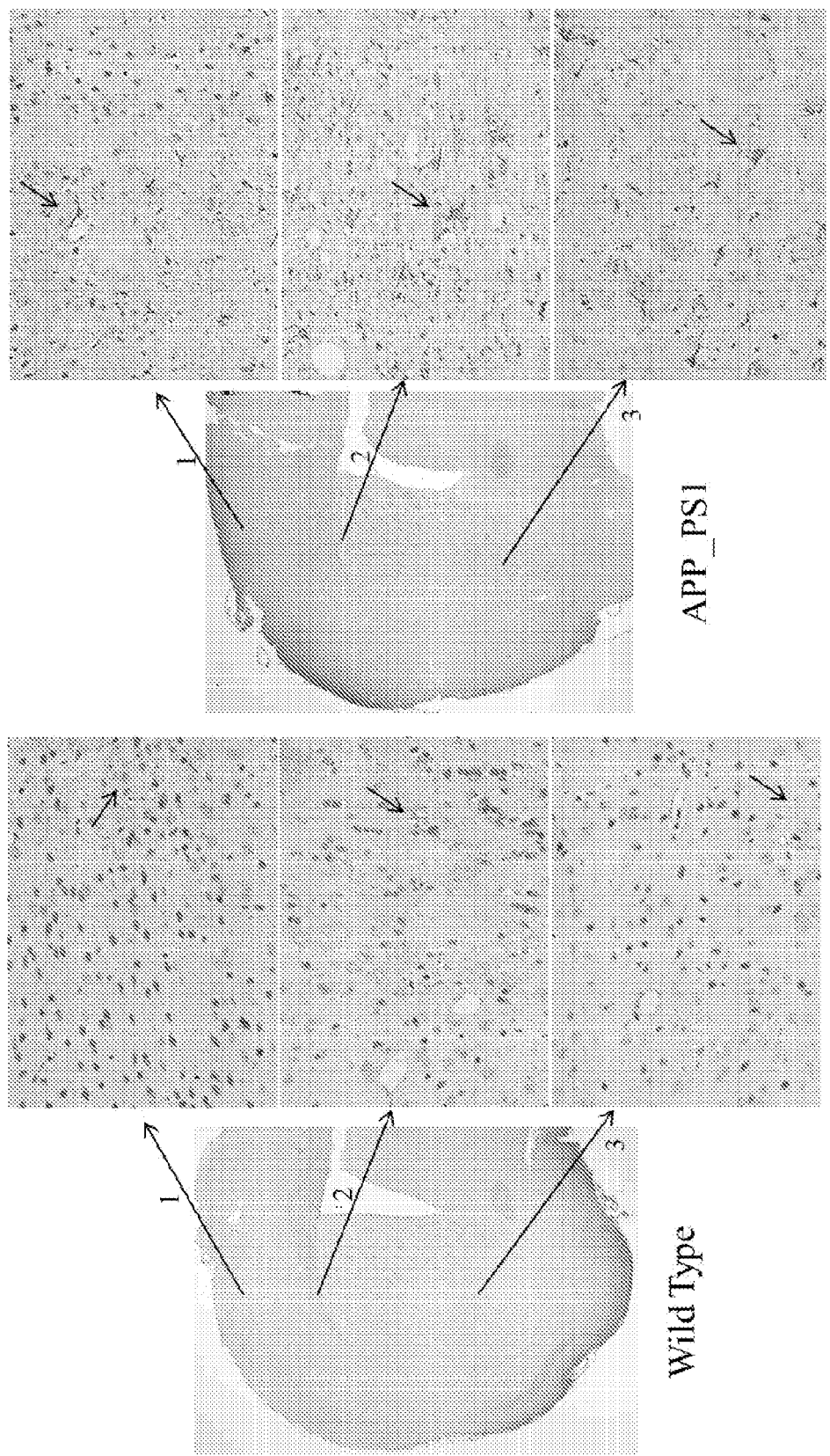
FIG. 30 shows the GFAP immunostain brain slices from the WT and the APP-PS1 mouse.

To observe the glial cells proliferation, immunostaining against GFAP was performed both on the APP-PS1 and WT mice brain slices and the results are shown in FIG. 30. FIG. 30 shows the GFAP immunostain brain slices from a WT and an APP-PS1 mouse. The APP-PS1 mice brain shows the higher intensity of GFAP immunoreactivity than the WT mice signifying astrocyte proliferation in all areas (arrows 1, 2 and 3). The astrocytes proliferation in APP-PS1 mice is apparent in much larger area. The GFAP-positive cells are interlocking into meshes in the APP-PS1 mice. The high resolution (20×) images from three regions of both the WT and APP-PS1 mouse show the expression of GFAP. In all regions, higher expression of GFAP can be seen in the APP-PS1 mouse. Compared to other brain regions, the corpus collosum shows higher glial cells proliferation in APP-PS1 mice compared to the cortex region (arrows 1 and 2) and also corresponds to the higher MICEST contrast (arrow 2). In the selected voxel region, where MICEST and MRS showed ~50% increase of [MI], a corresponding higher intensity of GFAP immunoreactivity in APP-PS1 mice was observed (arrow 3).

In the above studies, the inventors have performed high resolution mapping of MI in the APP-PS1 transgenic mouse model of AD using the MICEST technique. Higher MICEST contrast in APP-PS1 mice was observed compared to WT mice and the results were further validated through comparable change of [MI] on $^1$HMRS. Immunohistochemistry analysis showed elevated proliferation of glial cells in APP-PS1 mice than WT mice. The higher MICEST contrast in APP-PS1 mice correlates with higher glial cells proliferation and potentially can be used to monitor glial cells proliferation non-invasively.

In these studies, the APP-PS1 mouse model was used as this model matches most closely with the neurochemical and neurological profile in human AD. In an earlier MRS study, most profound increase in MI in an APP-PS1 mouse was observed at the age of 20 months. All mice used in the above studies were also ~20 months old and higher MI signals were observed in the APP-PS1 mice brain. Compared to WT mice, reduced signals from NAA and glutamate (Glu) were found in APP-PS1 mice, which is consistent with the previously reported studies, where a reduction in the levels of NAA and Glu with advancing age was found in APP-PS1 mice. A gradually increased [MI] during AD progression in the APP-PS1 mice model starting from 3 months to 23 months has been reported using $^1$HMRS. This has been attributed to increased [MI] concentration to the active glial cells proliferation during these periods. Significantly increased MI has been shown in 3 months old APP-PS1 transgenic mice along with higher GFAP expression compared to age matched WT mice. The above findings show that it is indeed possible to track the glial cell proliferation in transgenic animal models of AD using $^1$HMRS MI. However, using $^1$HMRS, MI cannot be imaged at high resolution and thus brain regions with different amount of glial cells proliferation cannot be easily monitored.

It is worth comparing the potential advantage of detecting sensitivity of CEST compared to traditional MRS measurement based on aliphatic protons (—CH). Theoretically, for each mM MI, proton MRS detects signal from six —CH groups (i.e., 6 mM protons). On the other hand, from FIG. 25, 1 mM MI leads to ~1.4% CEST effect. This is equivalent to a 1.54 M decrease in a water proton concentration of 110 M. By this reasoning, the MICEST MRI provides (1540/6=233) ~256 fold sensitivity amplification under physiological conditions. However, the integration of the MICEST spectrum of 10 mM MI is ~1000 times higher than that of experimental $^1$H MRS of MI integration (106546.6/90.16=1181.7) (FIGS. 25B and 25D). Some of this difference comes from the relaxation losses of MI at TE=16 ms (due to relatively short $T_2$s) as well as possible direct saturation as well as cross relaxation between saturated water and MI during water suppression in MRS data acquisition. Nonetheless, as the experimental data demonstrates, with experimental parameters used, the actual sensitivity of CEST realizable experimentally is ~1000 times higher than $^1$H MRS. This sensitivity amplification should make it feasible to detect relatively small changes in MI levels at high resolution (voxel size of 0.02 cc).

A MICEST map not only reflects the spatial distribution of MI in brain, but also highlights the regions with active glial cells proliferation. Higher MICEST contrast in APP-PS1 mice reflects higher [MI] and active glial cells proliferation which is supported by the $^1$HMRS as well as GFAP immunohistochemistry analysis. The Z-spectra asymmetry curves are rather broad and show a MICEST peak at ~0.6 ppm which is consistent with the previous study on human brain described above. Earlier, in AD pathology it has been shown that white matter regions associate with the higher degree of glial cells proliferation and neuronal damage. In the current study, corpus collosum, which is a pure white matter region, showed higher MICEST contrast with increased proliferation of glial cells as shown in FIG. 30 (arrow 2). However, direct correlation between MICEST and GFAP expression cannot be performed due to the difference in their spatial resolution as well as slice positions. Although in the current study ~20 months old mice were examined, based on the published MRS results on a range of ages of AD mice and potential higher sensitivity of MICEST, the inventors expect that the MICEST can map glial cell changes in young (>3 month) AD mice as well.

Most patients with MCI ultimately develop dementia, so it is reasonable to regard neuroimaging findings that are sensitive to the changes in the brains of people with MCI as markers of early or "prodromal" AD pathologic changes. In humans, a gradual increase in MI concentration has been shown from control to MCI to full onset of AD. It has been suggested that $^1$HMRS quantified MI can be used as a biomarker to detect the early changes in AD pathology at the stage of MCI and may serve as a tool to monitor the therapeutic response. However, due to large voxel size (8 cm$^3$) it is difficult to monitor the regional changes in [MI] as well as glial cells proliferation. However, in vivo mapping of the regional glial cells proliferation in AD patients was performed earlier by exploiting the PET ligands. The wide clinical utility of PET technique is hampered by the use of radioactive ligand and low spatial resolution. Mapping of MI through the MICEST technique will allow monitoring the regional changes in MI concentration at high resolution (~200 micron) during disease course and in response to treatment. Also, the MICEST technique does not require any exogenous contrast administration and is quite easy to setup in the routine clinical MR imaging.

Those skilled in the art will appreciate that precise saturation of exchangeable protons requires perfect $B_0$ homogeneity. $B_0$ inhomogeneity could interfere with the selective saturation frequency and makes the two selective frequencies asymmetric to bulk water. In that case, the CEST effect would reflect differences between direct saturation and magnetization transfer effects. The CEST effect is also highly dependent on saturation $B_1$ amplitude. With fixed saturation duration, a higher $B_1$ can induce a higher CEST effect, and $B_1$ homogeneity is a critical requirement for quantitative CEST imaging. Artifacts induced by $B_0$ and $B_1$ field inhomogeneity and the corresponding correction algorithms have been previously discussed in detail. Accordingly, in the current study, the inventors used methods described previously to correct the $B_1$ and $B_0$ induced artifacts due to small $B_0$ and $B_1$ variations. For proof of principle purposes, in the current study only a single slice with a two dimensional imaging sequence was imaged. However, those skilled in the art would appreciate that it would be relatively straightforward to implement a three dimensional acquisition of MICEST map.

The findings of this study suggests that the in vivo detection of altered regional MI concentration in AD is feasible at high resolution using the MICEST technique and provides a novel non-invasive contrast method to detect the glial cells proliferation. Further, MICEST mapping could serve as in vivo surrogate marker of therapeutic efficacy in trials of agents designed to reduce neurotoxicity mediated by the activated glial cells during early disease onset in AD. Because of its noninvasive and repeatable nature, MICEST mapping could aid drug discovery efforts in transgenic models of AD.

Figure 31:
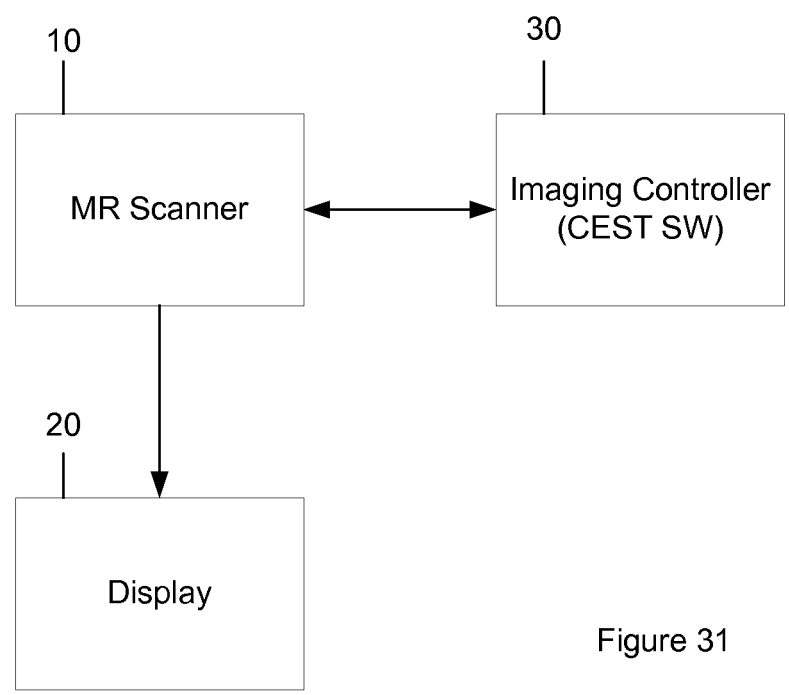
FIG. 31 illustrates a conventional MR scanner that displays the obtained MR images on a display under control of an imaging controller programmed to implement any or all of the CEST imaging pulse sequences and CEST imaging protocols described herein.

Those skilled in the art also will readily appreciate that many additional modifications are possible in the exemplary embodiment without materially departing from the novel teachings and advantages of the invention. For example, the CEST imaging pulse sequences and CEST imaging protocols described herein may be implemented in software that runs on the processors of any of a number of suitable MR scanning and display devices currently in use to control same to generate the images shown and described herein. FIG. 31 illustrates in rudimentary form a conventional MR scanner 10 that displays the obtained MR images on a display 20. Imaging controller 30 includes a processor programmed to implement any or all of the CEST imaging pulse sequences and CEST imaging protocols described herein. Accordingly, any such modifications are intended to be included within the scope of this invention as defined by the following exemplary claims.

What is claimed:

1. A method of obtaining the concentration of metabolites within the body using MR imaging, comprising:
    applying a Chemical Exchange Saturation Transfer (CEST) saturation pulse train at a range of frequency offsets around a frequency of exchangeable protons of a target metabolite as well as the same frequency offsets on the opposite of the water resonance;
    MR imaging a slice of the body containing the target metabolite to which the CEST saturation pulse has been applied;
    determining a CEST contrast image by taking a ratio of a difference image obtained by subtraction of saturation images obtained with saturation applied at both positive and negative frequencies with respect to water resonance and an image with no saturation; and
    displaying the CEST contrast image.

2. The method of claim 1, further comprising adjusting an amplitude and duration of the CEST saturation pulse train based on the proton exchange rate of the target metabolite.

3. The method of claim 1, wherein the CEST saturation pulse train comprises a variable number of pulses with variable shapes including rectangle and Hanning windowed rectangle, variable amplitudes, variable durations, and variable delays.

4. The method of claim 1, further comprising $B_0$ and $B_1$ correcting the saturation images before subtracting said saturation images.

5. The method of claim 1, wherein the target metabolite is at least one of gamma-aminobutyric acid, glutamate, myo-inositol, adenosine triphosphate (ATP), phospho-creatine, creatine, glycine, proline, albumin, alanine, and aspartate.

6. The method of claim 1, comprising the further step of using the concentration of the metabolite in the subtraction image as a biomarker for monitoring disease states correlated to the metabolite concentration.

7. The method of claim 1, wherein the image slice is taken from a subject's liver, comprising the further step of staging liver fibrosis and characterizing liver function by monitoring changes in the concentration of liver metabolites including proline, albumin, aspartate, and/or alanine in the CEST contrast image.

8. The method of claim 1, wherein the image slice is taken from a subject's myocardium, comprising the further step of differentiating non-infarcted viable myocardial tissue from infarcted tissue by measuring changes in the concentration of creatine in the subtraction image.

9. The method of claim 8, comprising the further step of measuring pH changes in the myocardial tissue to distinguish a region of the myocardium that is partially ischemic from non-infarcted myocardial viable myocardial tissue.

10. The method of claim 1, comprising the further steps of inducing stress in the myocardium and monitoring changes in the creatine levels in response to stress in the CEST contrast image.

11. The method of claim 1, wherein the image slice is taken from a subject's brain, comprising the further step of monitoring relative changes in levels of myo-inositol in the subject's brain.

12. The method of claim 11, comprising the further step of using the concentration of myo-inositol in the subtraction image as a biomarker for monitoring disease states correlated to the concentration of myo-inositol in the subject's brain, progression of said disease states, and/or efficacy of treatment of said disease states.

13. The method of claim 12, wherein the concentration of myo-inositol is used as a biomarker for monitoring the progression and/or the efficacy of treatment of Alzheimer's Disease.

14. The method of claim 11, comprising the further step of measuring pH changes in the brain to distinguish a region of hypoxia and stroke that is partially ischemic from healthy brain tissue.

15. The method of claim 1, wherein the image slice is taken from a subject's skeletal muscle, comprising the further step of differentiating well perfused muscle tissue from under perfused muscle tissue by measuring changes in the concentration of creatine in the subtraction image.

16. The method of claim 1, comprising the further steps of inducing stress in the muscle tissue and monitoring changes in the creatine levels in response to stress in the CEST contrast image.

17. A system for obtaining the concentration of metabolites within the body using MR imaging, comprising:
an MR scanner for imaging a subject's body;
an imaging controller that generates a Chemical Exchange Saturation Transfer (CEST) saturation pulse train at a range of frequency offsets around a frequency of exchangeable protons of a target metabolite as well as the same frequency offsets on the opposite of the water resonance and applies said CEST saturation pulse to said MR scanner for MR imaging a slice of the subject's body containing the target metabolite to which the CEST saturation pulse has been applied, and that determines a CEST contrast image by taking a ratio of a difference image obtained by subtraction of saturation images obtained with saturation applied at both positive and negative frequencies with respect to water resonance and an image with no saturation; and
a display that displays the CEST contrast image.

18. The system of claim 17, wherein the imaging controller adjusts an amplitude and duration of the CEST saturation pulse train based on the proton exchange rate of the target metabolite.

19. The system of claim 17, wherein the CEST saturation pulse train comprises a variable number of pulses with variable shapes including rectangle and Hanning windowed rectangle, variable amplitudes, variable durations, and variable delays.

20. The system of claim 1, wherein the saturation images are $B_0$ and $B_1$ corrected saturation images.

21. The system of claim 17, wherein the target metabolite is at least one of gamma-aminobutyric acid, glutamate, myo-inositol, adenosine triphosphate (ATP), phospho-creatine, creatine, glycine, proline, albumin, alanine, and aspartate.

* * * * *